United States Patent
Makiyama

(10) Patent No.: US 11,094,813 B2
(45) Date of Patent: Aug. 17, 2021

(54) COMPOUND SEMICONDUCTOR DEVICE, METHOD OF MANUFACTURING COMPOUND SEMICONDUCTOR DEVICE, AND AMPLIFIER

(71) Applicant: FUJITSU LIMITED, Kawasaki (JP)

(72) Inventor: Kozo Makiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/733,270

(22) Filed: Jan. 3, 2020

(65) Prior Publication Data
US 2020/0251584 A1 Aug. 6, 2020

(30) Foreign Application Priority Data
Feb. 5, 2019 (JP) .............................. JP2019-019109

(51) Int. Cl.
| | | |
|---|---|---|
| *H01L 29/778* | (2006.01) | |
| *H01L 29/51* | (2006.01) | |
| *H01L 29/66* | (2006.01) | |
| *H02M 3/335* | (2006.01) | |

(Continued)

(52) U.S. Cl.
CPC ........ *H01L 29/7786* (2013.01); *H01L 29/512* (2013.01); *H01L 29/66462* (2013.01); *H02M 1/4208* (2013.01); *H02M 3/33576* (2013.01); *H03F 3/21* (2013.01); *H03F 2200/451* (2013.01)

(58) Field of Classification Search
CPC ............... H01L 29/7786; H01L 29/512; H01L 29/66462; H01L 23/3171; H01L 23/3192; H01L 29/42376; H01L 29/2003; H03F 2200/451; H03F 3/21; H03F 2200/207; H03F 1/3247; H03F 3/245; H03F 3/195; H02M 3/33576; H02M 1/4208; H02M 1/4225; H02M 2001/007
See application file for complete search history.

(56) References Cited

U.S. PATENT DOCUMENTS

| | | | |
|---|---|---|---|
| 2009/0166815 A1* | 7/2009 | Makiyama | ........ H01L 29/66462 257/640 |
| 2010/0244104 A1 | 9/2010 | Makiyama et al. | |

(Continued)

FOREIGN PATENT DOCUMENTS

| | | |
|---|---|---|
| JP | 2009-267155 A | 11/2009 |
| JP | 2010-238982 A | 10/2010 |
| JP | 2011-23617 A | 2/2011 |

*Primary Examiner* — Mohammed R Alam
(74) *Attorney, Agent, or Firm* — Fujitsu Patent Center

(57) ABSTRACT

A compound semiconductor device includes a semiconductor multilayer structure including an electron transit layer and an electron supply layer of a compound semiconductor; a source electrode, a gate electrode, and a drain electrode that are disposed above the semiconductor multilayer structure and are aligned in a first direction; a first insulating film that is formed on the semiconductor multilayer structure between the gate electrode and the drain electrode, and has a tensile stress; a second insulating film that is formed on the semiconductor multilayer structure between the gate electrode and the source electrode, and has a compressive stress; and a protective film that is formed between the first insulating film and the semiconductor multilayer structure, and between the second insulating film and the semiconductor multilayer structure.

5 Claims, 32 Drawing Sheets

(51) Int. Cl.
*H03F 3/21* (2006.01)
*H02M 1/42* (2007.01)

(56) References Cited

U.S. PATENT DOCUMENTS

2013/0264657 A1* 10/2013 Komatani ........... H01L 29/7787
257/402
2013/0292699 A1* 11/2013 Ueno ................ H01L 29/42316
257/76

* cited by examiner

COMPOUND SEMICONDUCTOR DEVICE, METHOD OF MANUFACTURING COMPOUND SEMICONDUCTOR DEVICE, AND AMPLIFIER

CROSS-REFERENCE TO RELATED APPLICATION

This application is based upon and claims the benefit of priority of the prior Japanese Patent Application No. 2019-19109, filed on Feb. 5, 2019, the entire contents of which are incorporated herein by reference.

FIELD

The embodiments discussed herein are related to a compound semiconductor device, a method of manufacturing a compound semiconductor device, and an amplifier.

BACKGROUND

A nitride semiconductor has characteristics such as a high saturation electron velocity and a wide bandgap. For this reason, various studies have been made on applying a nitride semiconductor to a high-breakdown-voltage, high-output compound semiconductor device, taking advantage of these characteristics. For example, the bandgap of GaN, which is a kind of nitride semiconductor, is 3.4 eV, which is wider than the bandgap of Si (1.1 eV) and the bandgap of GaAs (1.4 eV). Accordingly, GaN has a high breakdown field strength, and is significantly promising as the material of a compound semiconductor device for a power supply that achieves high-voltage operation and high output.

A large number of compound semiconductor devices using nitride semiconductors have been reported with respect to field effect transistors, or particularly, high electron mobility transistors (HEMTs). For example, in GaN-based HEMTs, attention is being drawn to AlGaN/GaN-HEMTs each using a GaN layer as the electron transit layer (the channel layer) and an AlGaN layer as the electron supply layer. In an AlGaN/GaN-HEMT, strain is caused in AlGaN due to the lattice constant difference between GaN and AlGaN. A high-concentration two-dimensional electron gas (2DEG) is then obtained through piezoelectric polarization generated by this strain and spontaneous polarization of AlGaN. Therefore, AlGaN/GaN-HEMTs are expected as high-power devices for communications, high-efficiency switch elements, high-breakdown-voltage power devices for electric vehicles and the like, and the like.

A further increase in current density is being expected these days. However, if the current density is increased in a conventional compound semiconductor device, the drain breakdown voltage will drop. In view of the above, it is desirable to be able to increase the current density while maintaining the drain breakdown voltage. Japanese Laid-open Patent Publication No. 2009-267155, Japanese Laid-open Patent Publication No. 2011-23617, Japanese Laid-open Patent Publication No. 2010-238982, and the like are disclosed as related art, for example.

SUMMARY

According to an aspect of the embodiments, a compound semiconductor device includes a semiconductor multilayer structure including an electron transit layer and an electron supply layer of a compound semiconductor; a source electrode, a gate electrode, and a drain electrode that are disposed above the semiconductor multilayer structure and are aligned in a first direction; a first insulating film that is formed on the semiconductor multilayer structure between the gate electrode and the drain electrode, and has a tensile stress; a second insulating film that is formed on the semiconductor multilayer structure between the gate electrode and the source electrode, and has a compressive stress; and a protective film that is formed between the first insulating film and the semiconductor multilayer structure, and between the second insulating film and the semiconductor multilayer structure.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

The present inventor made intensive studies to solve the above problems. As a result, it became evident that it is possible to increase the current density while maintaining a drain breakdown voltage, by providing a silicon nitride film having a compressive stress between the gate electrode and the source electrode, and a silicon nitride film having a tensile stress between the gate electrode and the drain electrode. Alternatively, as will be described later, magnesium oxide films or the like, instead of silicon nitride films, may be used as the compressive stress film and the tensile stress film.

(Reference Example)

Figure 1:
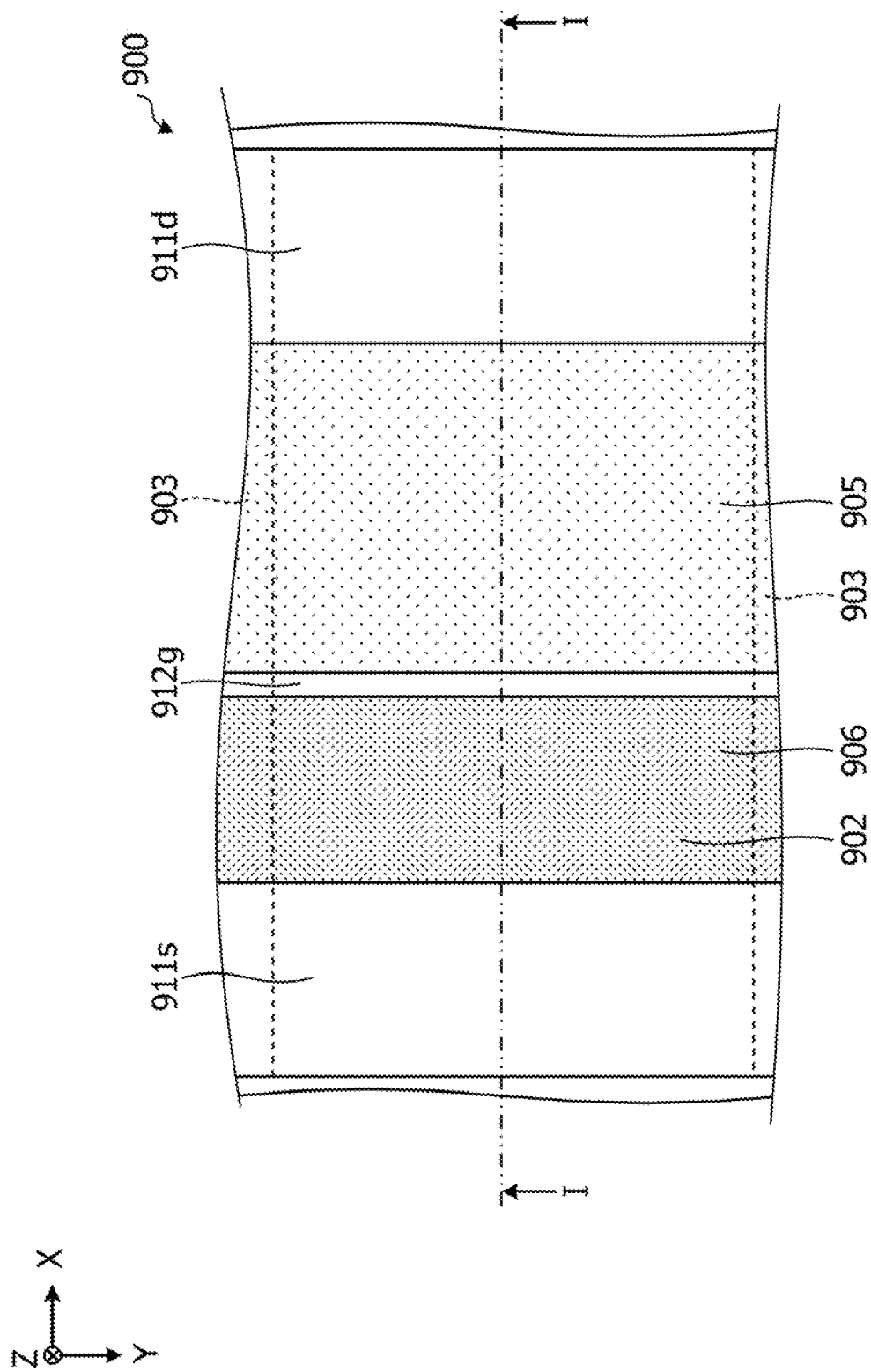
FIG. 1 is a diagram showing the layout of a compound semiconductor device of a reference example.
Figure 2:
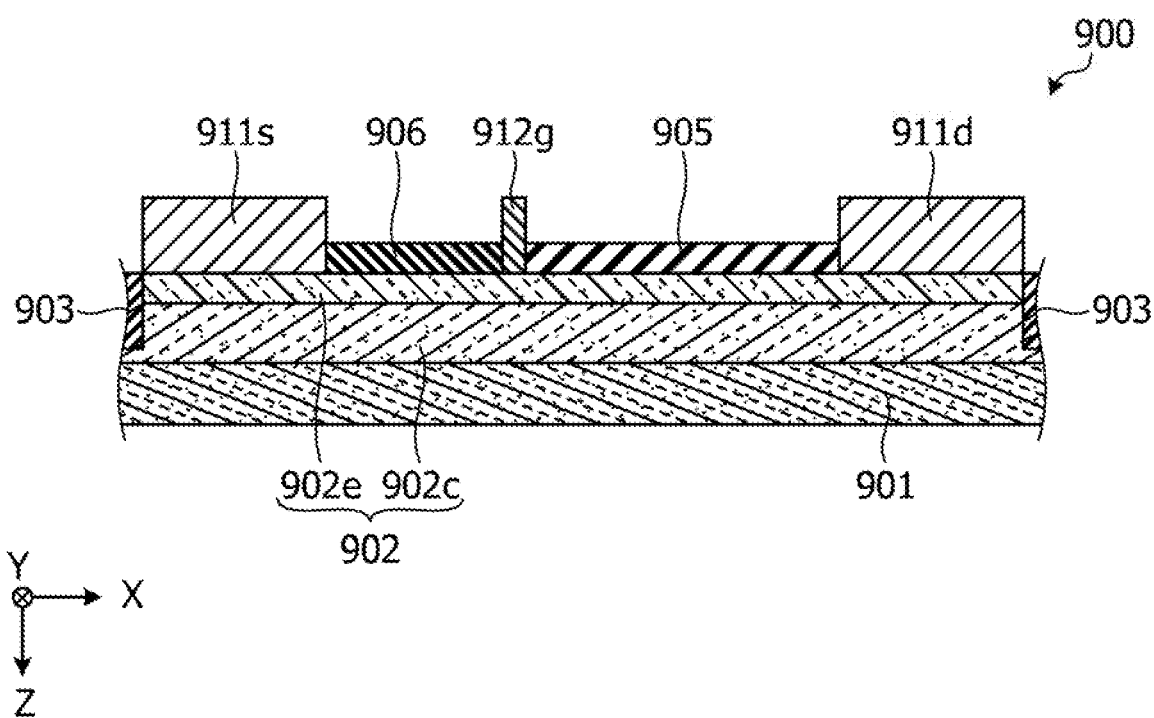
FIG. 2 is a cross-sectional diagram showing the structure of the compound semiconductor device of the reference example.

FIG. 1 is a diagram showing the layout of a compound semiconductor device of a reference example. FIG. 2 is a cross-sectional view showing the structure of the compound semiconductor device of the reference example. FIG. 2 corresponds to a cross-sectional view taken along the line I-I defined in FIG. 1.

As illustrated in FIGS. 1 and 2, a compound semiconductor device 900 of the reference example has a semiconductor multilayer structure 902 including an electron transit layer 902c and an electron supply layer 902e of a compound semiconductor. The compound semiconductor device 900 includes a source electrode 911s, a gate electrode 912g, and a drain electrode 911d that are disposed on the semiconductor multilayer structure 902 and are aligned in the X direction. The compound semiconductor device 900 includes: a silicon nitride film 905 that is formed on the semiconductor multilayer structure 902 between the gate electrode 912g and the drain electrode 911d, and has a tensile stress; and a silicon nitride film 906 that is formed on the semiconductor multilayer structure 902 between the gate electrode 912g and the source electrode 911s, and has a compressive stress. Inside the silicon nitride film 905, a tensile stress acts in a plane (an X-Y plane) parallel to a surface of the semiconductor multilayer structure 902. Inside the silicon nitride film 906, a compressive stress acts in a plane (an X-Y plane) parallel to the surface of the semiconductor multilayer structure 902.

In the compound semiconductor device 900, by virtue of the stress from the silicon nitride film 906 having a compressive stress, a larger quantity of two-dimensional electron gas (2DEG) is induced at the heterojunction interface between the electron transit layer 902c and the electron supply layer 902e, between the gate electrode 912g and the source electrode 911s. As a result, the resistance between the gate electrode 912g and the source electrode 911s is reduced, the on-resistance of the compound semiconductor device 900 is lowered, and thus, the effect to achieve a higher efficiency through an increase in current density and a decrease in resistive loss is achieved.

Further, the stress from the silicon nitride film 905 having a tensile stress reduces the induction of 2DEG at the heterojunction interface between the electron transit layer 902c and the electron supply layer 902e, between the gate electrode 912g and the drain electrode 911d. As a result, the resistance between the gate electrode 912g and the drain electrode 911d becomes higher, the potential gradually drops in the direction from the drain electrode 911d toward the gate electrode 912g, the electric field strength at the drain end of the gate electrode 912g becomes lower, and the effect to increase the drain breakdown voltage is achieved.

However, it was also found that, in a case where the silicon nitride films 905 and 906 having internal stress were formed directly on the semiconductor multilayer structure 902, it was difficult to achieve excellent characteristics due to damage to the semiconductor multilayer structure 902 or the like.

Embodiments of the present disclosure will be specifically described below with reference to the accompanying drawings. Note that, in this specification and the drawings, components having substantially the same functional configuration are denoted by the same reference numerals, and explanation thereof will not be unnecessarily repeated.

First Embodiment

Figure 3:
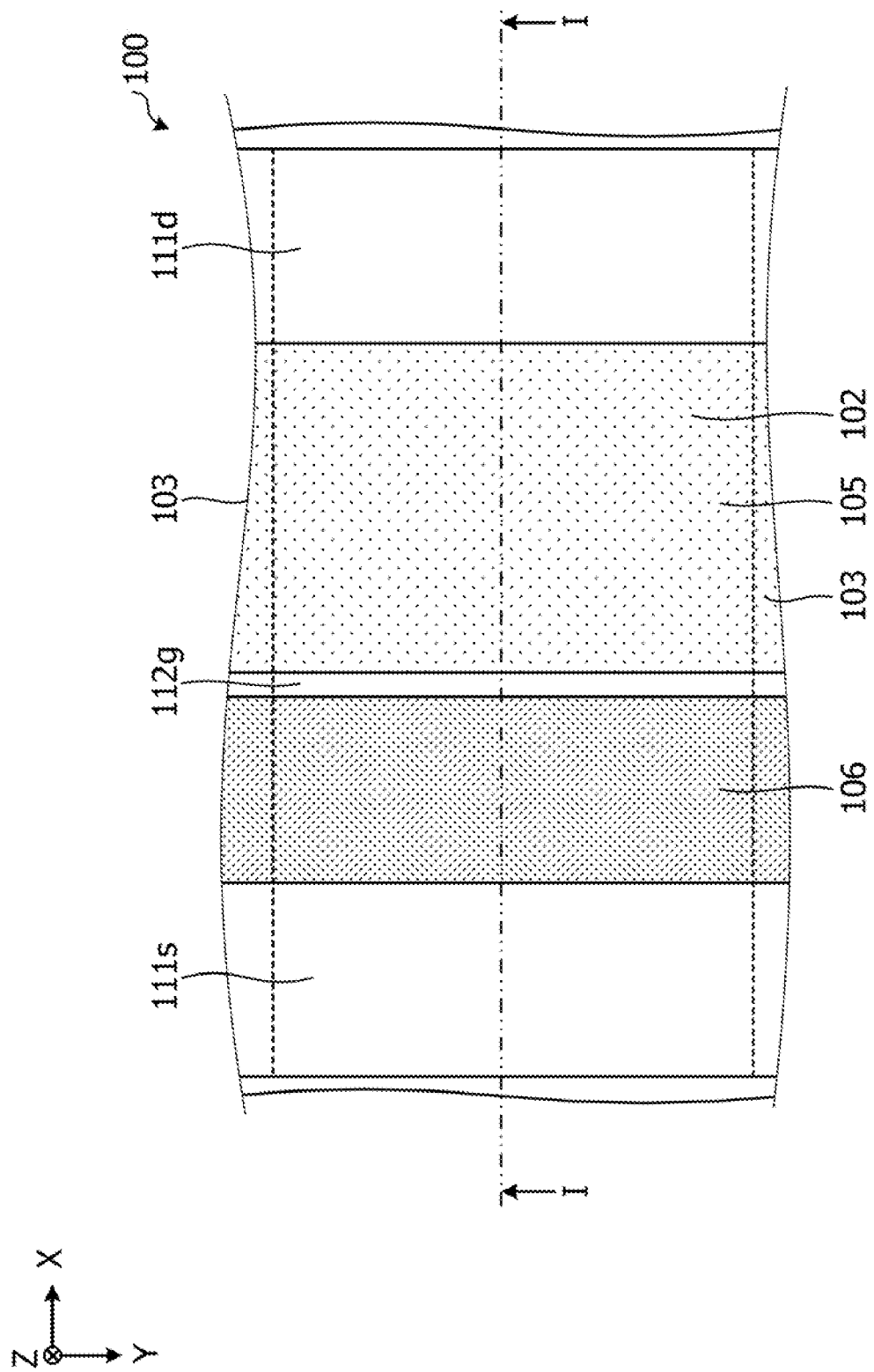
FIG. 3 is a diagram showing the layout of a compound semiconductor device according to a first embodiment.
Figure 4:
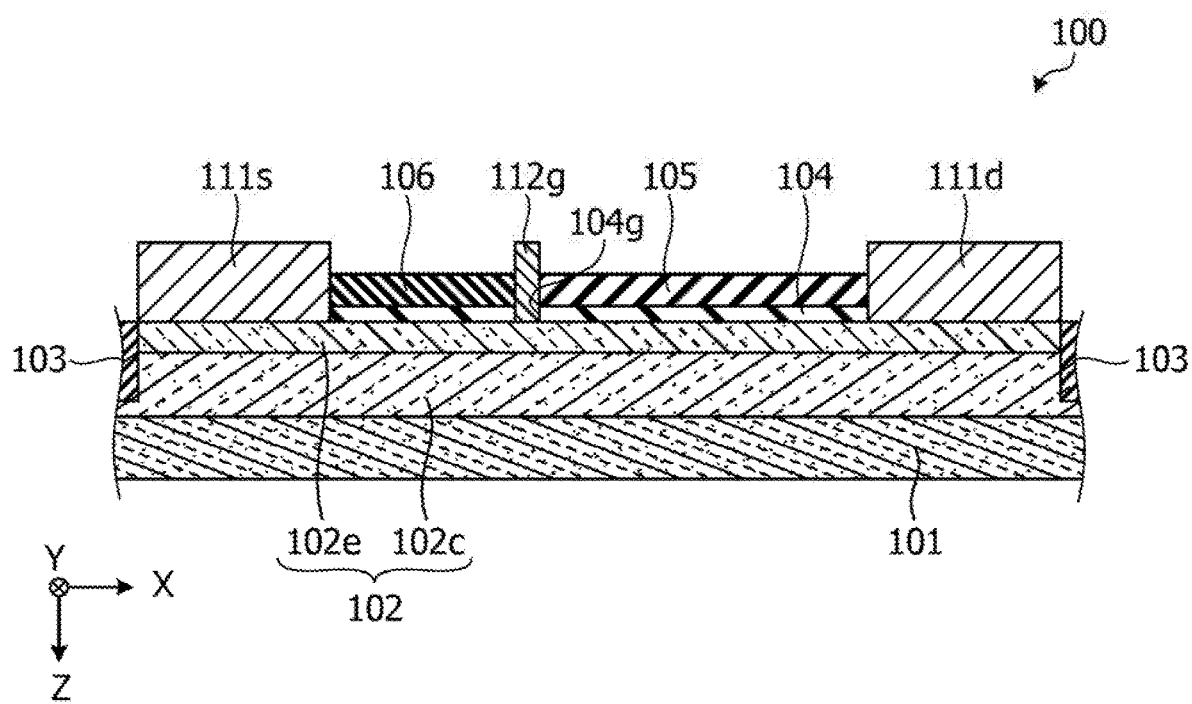
FIG. 4 is a cross-sectional diagram showing the structure of the compound semiconductor device according to the first embodiment.

A first embodiment relates to a compound semiconductor device including an HEMT. FIG. 3 is a diagram showing the layout of a compound semiconductor device according to the first embodiment. FIG. 4 is a cross-sectional diagram showing the structure of the compound semiconductor device according to the first embodiment. FIG. 4 corresponds to a cross-sectional view taken along the line I-I defined in FIG. 3.

As illustrated in FIGS. 3 and 4, a compound semiconductor device 100 according to the first embodiment has a semiconductor multilayer structure 102 including an electron transit layer 102c and an electron supply layer 102e of a compound semiconductor. The compound semiconductor device 100 includes a source electrode 111s, a gate electrode 112g, and a drain electrode 111d that are disposed on the semiconductor multilayer structure 102 and are aligned in the X direction. The compound semiconductor device 100 includes a protective film 104 formed on the semiconductor multilayer structure 102 between the gate electrode 112g and the drain electrode 111d and between the gate electrode 112g and the source electrode 111s. The compound semiconductor device 100 includes: a tensile stress film 105 that is formed on the protective film 104 between the gate electrode 112g and the drain electrode 111d; and a compressive stress film 106 that is formed on the protective film 104 between the gate electrode 112g and the source electrode 111s. Inside the tensile stress film 105, a tensile stress acts in a plane (an X-Y plane) parallel to a surface of the semiconductor multilayer structure 102. Inside the compressive stress film 106, a compressive stress acts in a plane (an X-Y plane) parallel to the surface of the semiconductor multilayer structure 102. The tensile stress film 105 is an example of the first insulating film, and the compressive stress film 106 is an example of the second insulating film.

Figure 5:
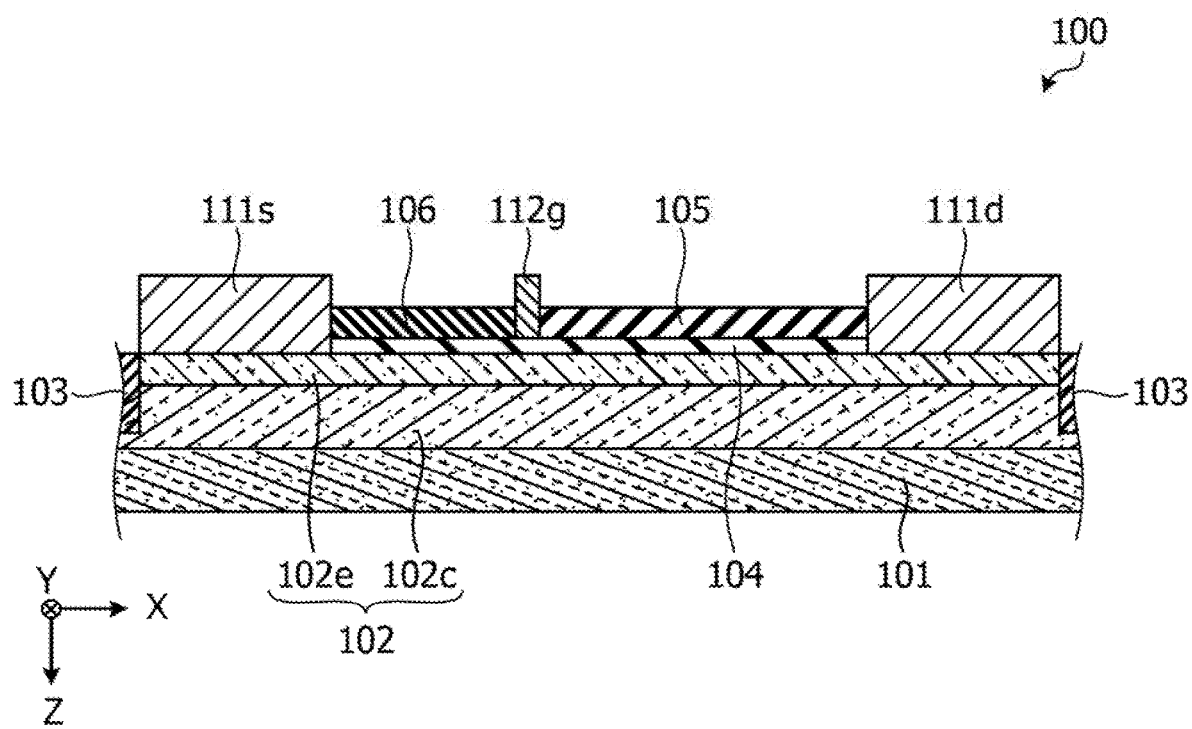
FIG. 5 is a cross-sectional diagram showing the structure of a modification of the compound semiconductor device according to the first embodiment.

For example, the tensile stress film 105 is designed to be in contact with the gate electrode 112g and the drain electrode 111d in the X direction, and the compressive stress film 106 is designed to be in contact with the gate electrode 112g and the source electrode 111s in the X direction. For example, an opening 104g is formed in the protective film 104, and the gate electrode 112g is in Schottky contact with the semiconductor multilayer structure 102 through the opening 104g. As illustrated in FIG. 5, the opening 104g is not necessarily formed in the protective film 104, and the gate electrode 112g may be formed on the protective film 104. In this configuration, part of the protective film 104 can be used as a gate insulating film. In this configuration, the number of interfaces between films of different kinds in the vicinity of the gate electrode 112g is smaller than that in a configuration in which a gate insulating film is formed separately from the protective film 104. Accordingly, the transient response due to interface traps can be reduced.

In the compound semiconductor device 100, by virtue of the stress from the compressive stress film 106, 2DEG is induced at the heterojunction interface between the electron transit layer 102c and the electron supply layer 102e, between the gate electrode 112g and the source electrode 111s. As a result, the resistance between the gate electrode 112g and the source electrode 111s is reduced, the on-resistance of the compound semiconductor device 100 is lowered, and thus, the effect to achieve a higher efficiency through an increase in current density and a decrease in resistive loss is achieved.

Further, the stress from the tensile stress film 105 reduces the induction of 2DEG at the heterojunction interface between the electron transit layer 102c and the electron supply layer 102e, between the gate electrode 112g and the drain electrode 111d. As a result, the resistance between the gate electrode 112g and the drain electrode 111d becomes higher, the potential gradually drops in the direction from the drain electrode 111d toward the gate electrode 112g, the electric field strength at the drain end of the gate electrode 112g becomes lower, and the effect to increase the drain breakdown voltage is achieved.

The method for forming the tensile stress film 105 and the compressive stress film 106 is not limited to any particular method, but the tensile stress film 105 and the compressive stress film 106 might be formed under a condition in which the base is likely to be damaged. In the compound semiconductor device 900 of the reference example, damage is caused mainly to the semiconductor multilayer structure 902. In the compound semiconductor device 100 according to the first embodiment, however, damage is caused mainly to the protective film 104. For this reason, the influence of damage to the channel can be alleviated.

From another point of view, a film that is preferable in terms of internal stress but is not preferable in terms of damage in the reference example can be used as the tensile stress film 105 or the compressive stress film 106. That is, a wider variety of films can be used as the tensile stress film 105 or the compressive stress film 106 in a preferred manner.

Further, the tensile stress film 105 easily contains an electron trap. When electrons in the channel are trapped in an electron trap, a current collapse might occur, and the on-resistance might become higher. In this embodiment, the protective film 104 between the tensile stress film 105 and the semiconductor multilayer structure 102 can reduce the capture of electrons. Thus, a current collapse can be reduced.

The material of the tensile stress film 105 is not limited to any particular material. For example, silicon nitride (SiN), magnesium oxide (MgO), or the like can be used for the tensile stress film 105. The magnitude of the tensile stress of the tensile stress film 105 and the magnitude of the compressive stress of the compressive stress film 106 are not limited, but may be 1 to 20 GPa, for example.

In a case where an internal stress film having an internal stress is formed on a silicon substrate, the silicon substrate is deformed depending on the internal stress applied from the internal stress film, and exhibits a curvature. Where the thickness of the silicon substrate is represented by h (m), the radius of curvature of the silicon substrate is r (m), and the thickness of the internal stress film is t (m), the internal stress s (Pa) of the internal stress film can be expressed by the equation (1) shown below. If s is positive, the internal stress film is a tensile stress film having a tensile internal stress. If s is negative, the internal stress film is a compressive stress film having a compressive stress.

$$s = 1.805 \times 10^{11} \times h^2 / 6rt \quad (1)$$

The material of the semiconductor multilayer structure 102 is not limited to any particular material. For example, GaN can be used for the electron transit layer 102c, and $Al_xGa_{1-x}N$ (0<x≤1) can be used for the electron supply layer 102e. Further, the thicknesses of the electron transit layer 102c and the electron supply layer 102e are not limited to any particular thicknesses. However, the thicker the electron supply layer 102e, the less the internal stress of the tensile stress film 105 and the compressive stress film 106 reaches the channel. In view of the influence of the internal stress, the thickness of the electron supply layer 102e is preferably 10 nm or smaller. Furthermore, to generate a two-dimensional electron gas (2DEG) with a sufficiently high concentration, the Al proportion x of $Al_xGa_{1-x}N$ is preferably 0.32 or higher, more preferably, 0.50 or higher, or even more preferably, 1.00. That is, 32% or more of the metal atoms in the nitride ($Al_xGa_{1-x}N$) is preferably Al atoms, more preferably, 50% or more of the metal atoms is Al atoms, or even more preferably, 100% of the metal atoms is Al atoms. The concentration of the 2DEG is not limited to any particular concentration, but is preferably $2 \times 10^{13}$ cm$^{-2}$ or higher. InAlN or InAlGaN may be used for the electron supply layer 102e.

In a case where AlN is used for the electron supply layer 102e, a recess for the source and a recess for the drain are preferably formed in the semiconductor multilayer structure 102, a low-resistance regrowth layer such as an n$^+$-GaN layer is formed in the recess, and the source electrode 111s and the drain electrode 111d are formed on the regrowth layer.

The material of the protective film 104 is not limited to any particular material. For example, silicon nitride, polyimide, or the like can be used for the protective film 104. In a case where the Young's modulus of the protective film 104 is too high, the internal stress of the tensile stress film 105 and the compressive stress film 106 hardly reaches the channel. In view of the influence of the internal stress, the Young's modulus of the protective film 104 is preferably 220 GPa or lower, more preferably, 200 GPa or lower, or even more preferably, 100 GPa or lower. The Young's modulus of silicon nitride is about 200 GPa, and the Young's modulus of polyimide is about 10 to 100 GPa. The internal stress of the protective film 104 is preferably as small as possible. For example, the absolute value of the internal stress is preferably 300 MPa or smaller, regardless of whether the internal stress is tensile stress or compressive stress.

The following effects of the protective film have been confirmed by the experiments conducted by the inventor. A stack of a GaN layer and an AlGaN layer was formed, and the mobility of the two-dimensional electron gas was measured. As a result, a mobility of about 2200 cm$^2$/V·s was obtained. A tensile stress film was then formed on the AlGaN layer, without formation of a protective film. As a result, the mobility dropped to about 1000 to 1050 m$^2$/V·s. On the other hand, when a protective film was formed on the AlGaN layer, and a tensile stress film was formed on the protective film, a mobility of about 2110 m$^2$/V·s was obtained.

Even in a case where the tensile stress film 105 is not provided, it is possible to achieve the effect to increase efficiency through an increase in current density and a decrease in resistive loss, as long as the compressive stress film 106 is provided. In this case, the protective film 104 is not necessarily provided between the gate electrode 112g and the drain electrode 111d. Likewise, even in a case where the compressive stress film 106 is not provided, it is possible to achieve the effect to increase the drain breakdown voltage, as long as the tensile stress film 105 is provided. In this case, the protective film 104 is not necessarily provided between the gate electrode 112g and the source electrode 111s.

Second Embodiment

Figure 6:
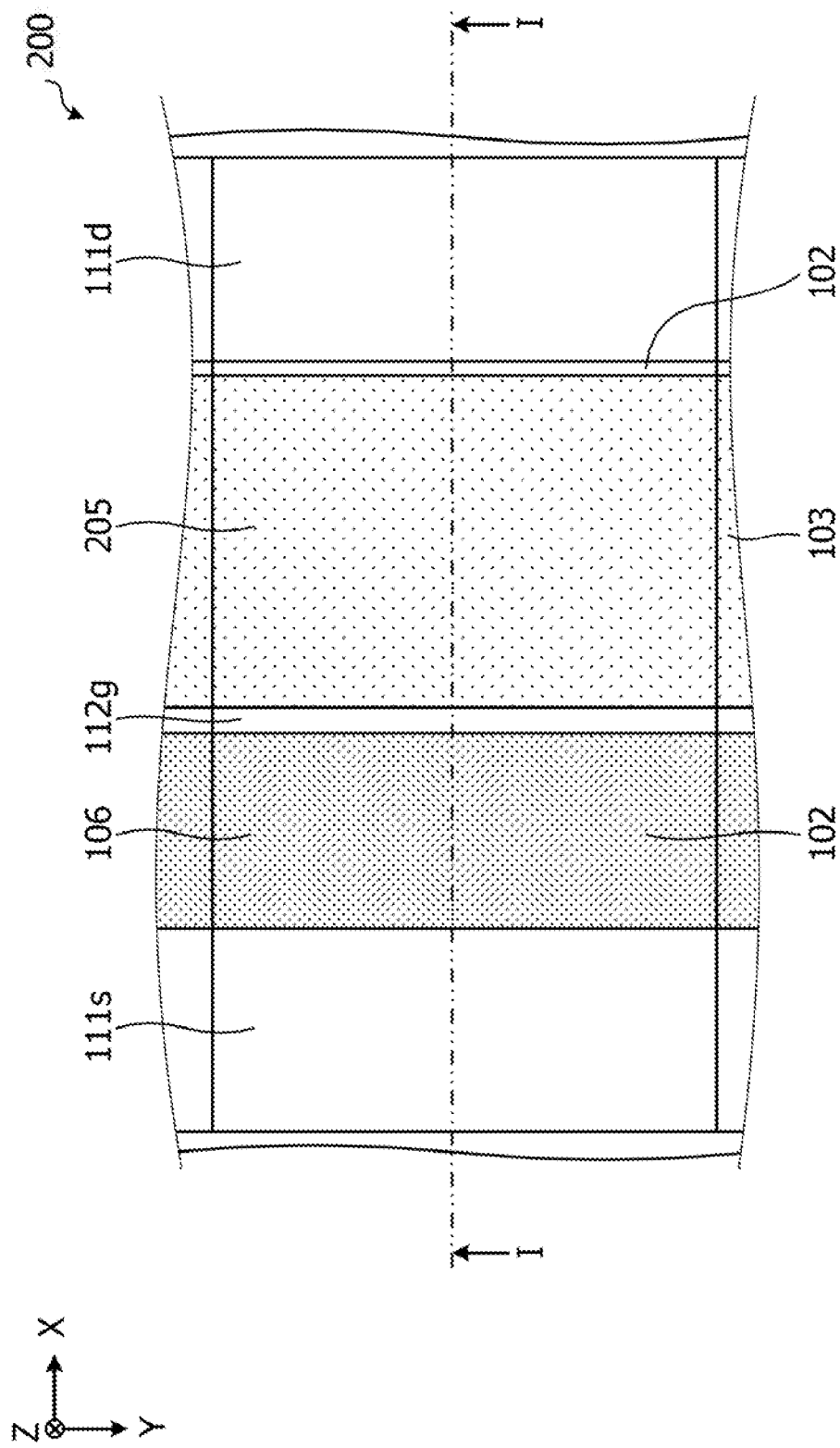
FIG. 6 is a diagram showing the layout of a compound semiconductor device according to a second embodiment.
Figure 7:
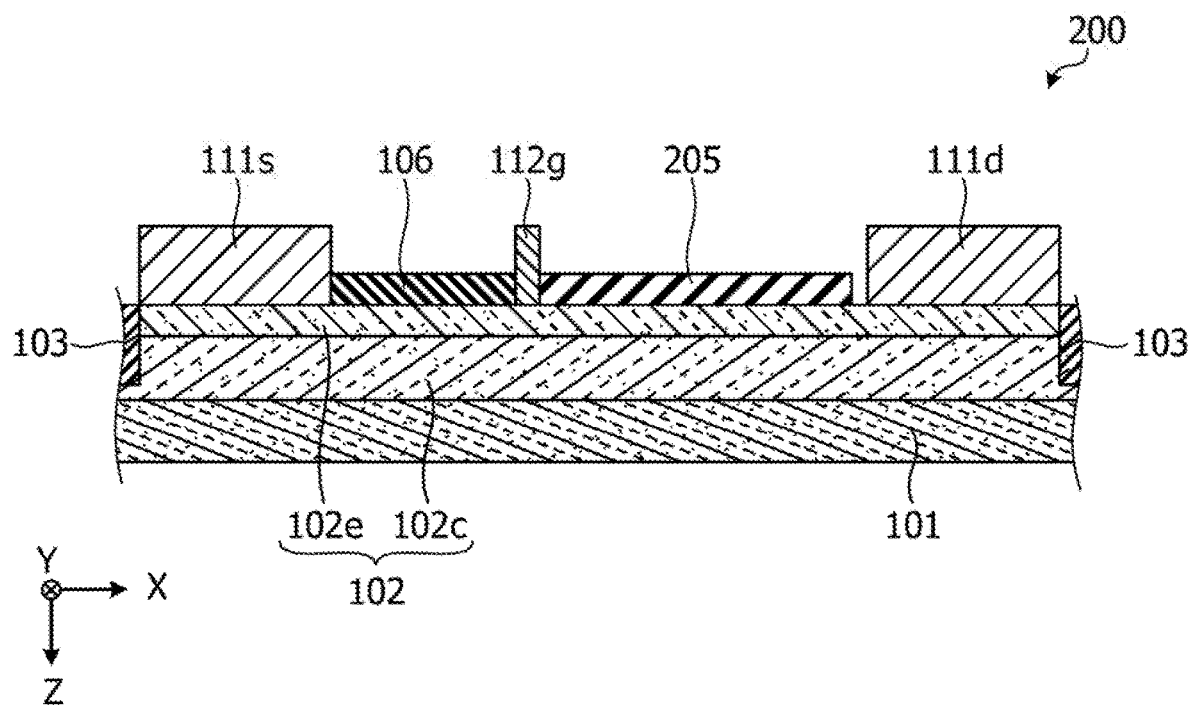
FIG. 7 is a cross-sectional diagram showing the structure of the compound semiconductor device according to the second embodiment.

A second embodiment relates to a compound semiconductor device including an HEMT. FIG. 6 is a diagram showing the layout of a compound semiconductor device according to the second embodiment. FIG. 7 is a cross-sectional diagram showing the structure of the compound semiconductor device according to the second embodiment. FIG. 7 corresponds to a cross-sectional view taken along the line I-I defined in FIG. 6.

As illustrated in FIGS. 6 and 7, a compound semiconductor device 200 according to the second embodiment includes a tensile stress film 205, instead of the tensile stress film 105. The tensile stress film 205 is designed to be in contact with the gate electrode 112g while being at a distance from the drain electrode 111d in the X direction. Further, the protective film 104 is not formed. The compound semiconductor device 200 has the same configuration as that of the first embodiment in other respects. The tensile stress film 205 is an example of the first insulating film.

Figure 8A:
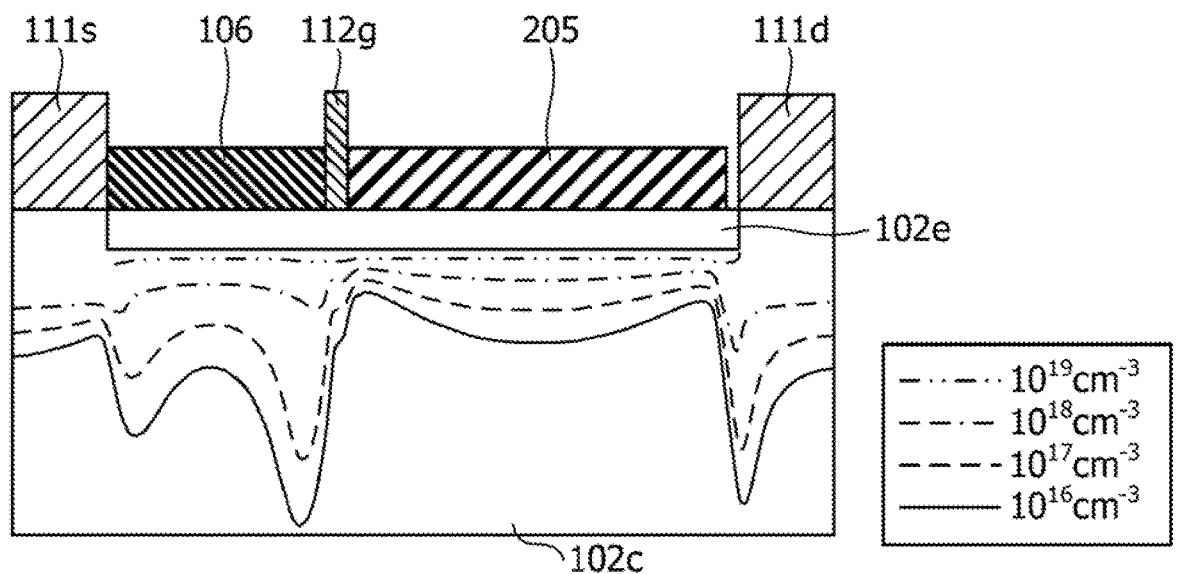
FIG. 8A is a diagram showing an electron concentration distribution in the compound semiconductor device according to the second embodiment.
Figure 8B:
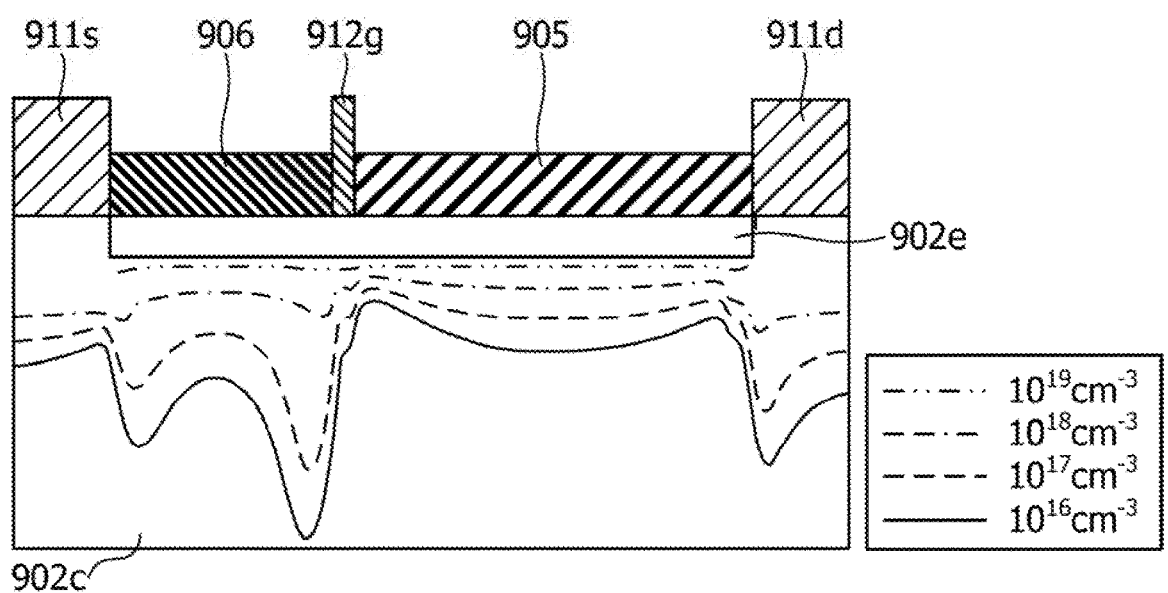
FIG. 8B is a diagram showing an electron concentration distribution in the compound semiconductor device of the reference example.

FIG. 8A is a diagram showing an electron concentration distribution in the compound semiconductor device according to the second embodiment. FIG. 8B is a diagram showing an electron concentration distribution in the compound semiconductor device of the reference example. In FIG. 8A, the distance between the tensile stress film 205 and the drain electrode 111d in the X direction is 50 nm. FIGS. 8A and 8B show the distributions of depth from the surfaces of the semiconductor multilayer structures 102 and 902 in which the electron concentration varies from 10$^{16}$ cm$^{-3}$, 10$^{17}$ cm$^{-3}$, 10$^{18}$ cm$^{-3}$, and to 10$^{19}$ cm$^{-3}$, in the Y direction, which is parallel to the surfaces of the semiconductor multilayer structures 102 and 902 and is perpendicular to the X direction.

As can be seen from comparison between FIG. 8A and FIG. 8B, the electron concentration drops in a wide region near the drain electrode 911$d$ in the reference example, while the electron concentration drops in a narrower region in the second embodiment. This indicates that the second embodiment can secure electrons at a high concentration.

If no stress from the tensile stress film 205 acts on the drain electrode 111$d$, the distance between the tensile stress film 105 and the drain electrode 111$d$ in the X direction is not limited.

Figure 9A:
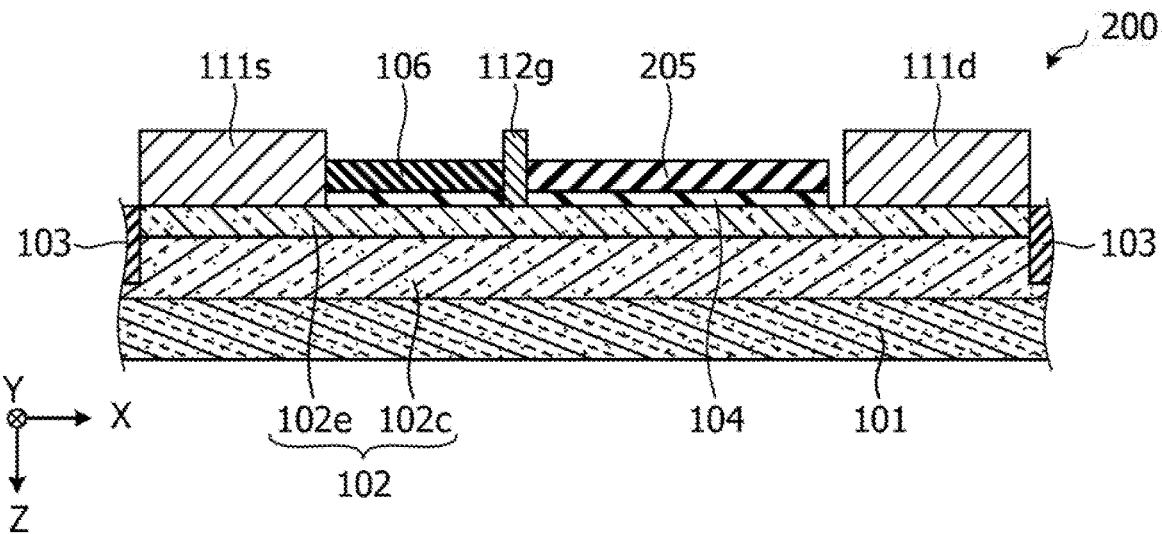
FIG. 9A is a cross-sectional diagram showing the structure of a (first) modification of the compound semiconductor device according to the second embodiment.

As illustrated in FIG. 9A, a protective film 104 may be formed between the tensile stress film 205 and the semiconductor multilayer structure 102, and the protective film 104 may also be formed between the compressive stress film 106 and the semiconductor multilayer structure 102. The protective film 104 may be designed to be in contact with the drain electrode 111$d$ in the X direction.

Figure 9B:
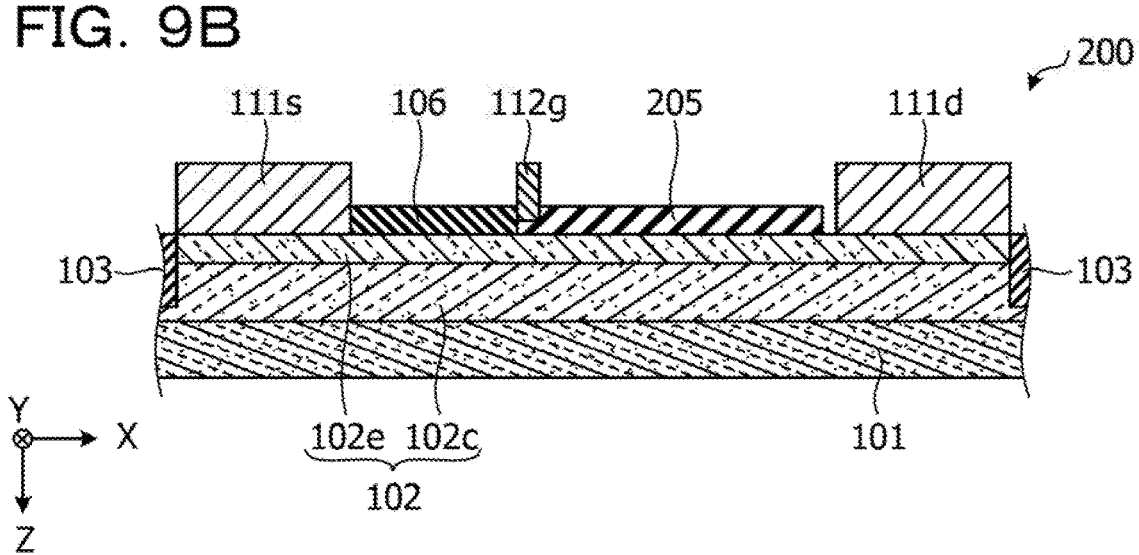
FIG. 9B is a cross-sectional diagram showing the structure of a (second) modification of the compound semiconductor device according to the second embodiment.
Figure 9C:
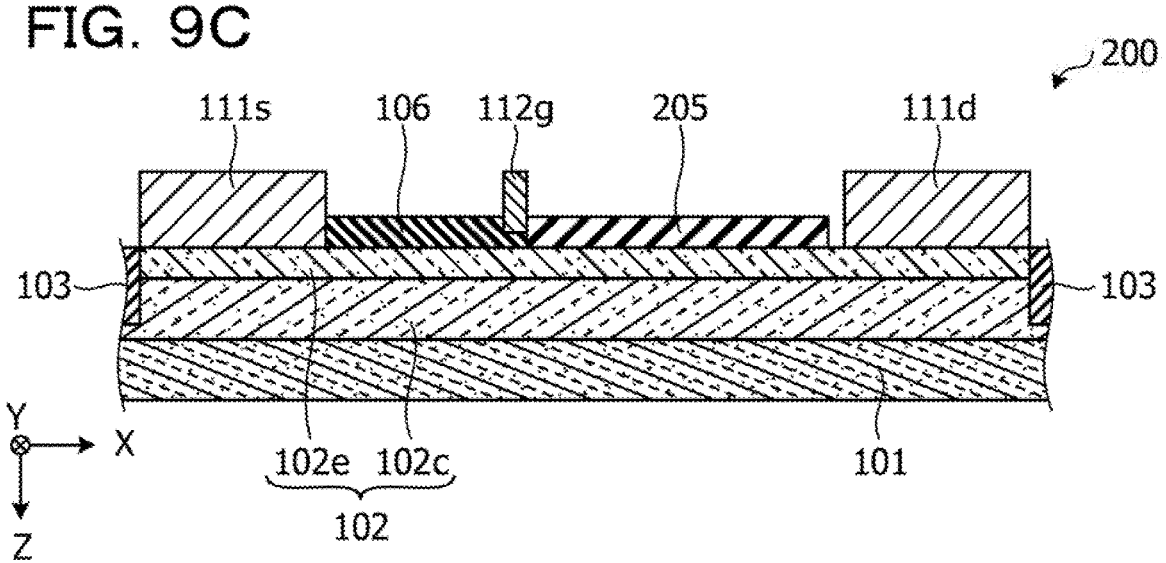
FIG. 9C is a cross-sectional diagram showing the structure of a (third) modification of the compound semiconductor device according to the second embodiment.

Further, the gate electrode 112$g$ may be formed on the protective film 104, as in a modification of the first embodiment (see FIG. 5). In this configuration, part of the protective film 104 can be used as a gate insulating film. As illustrated in FIG. 9B, part of the tensile stress film 205 may be used as a gate insulating film. As illustrated in FIG. 9C, part of the compressive stress film 106 may be used as a gate insulating film.

Even in a case where the compressive stress film 106 is not provided, it is possible to achieve the effect to increase the drain breakdown voltage while securing electrons at a high concentration in the vicinity of the drain electrode 111$d$, as long as the tensile stress film 205 is provided. In this case, the protective film 104 is not necessarily provided between the gate electrode 112$g$ and the source electrode 111$s$.

Third Embodiment

Figure 10:
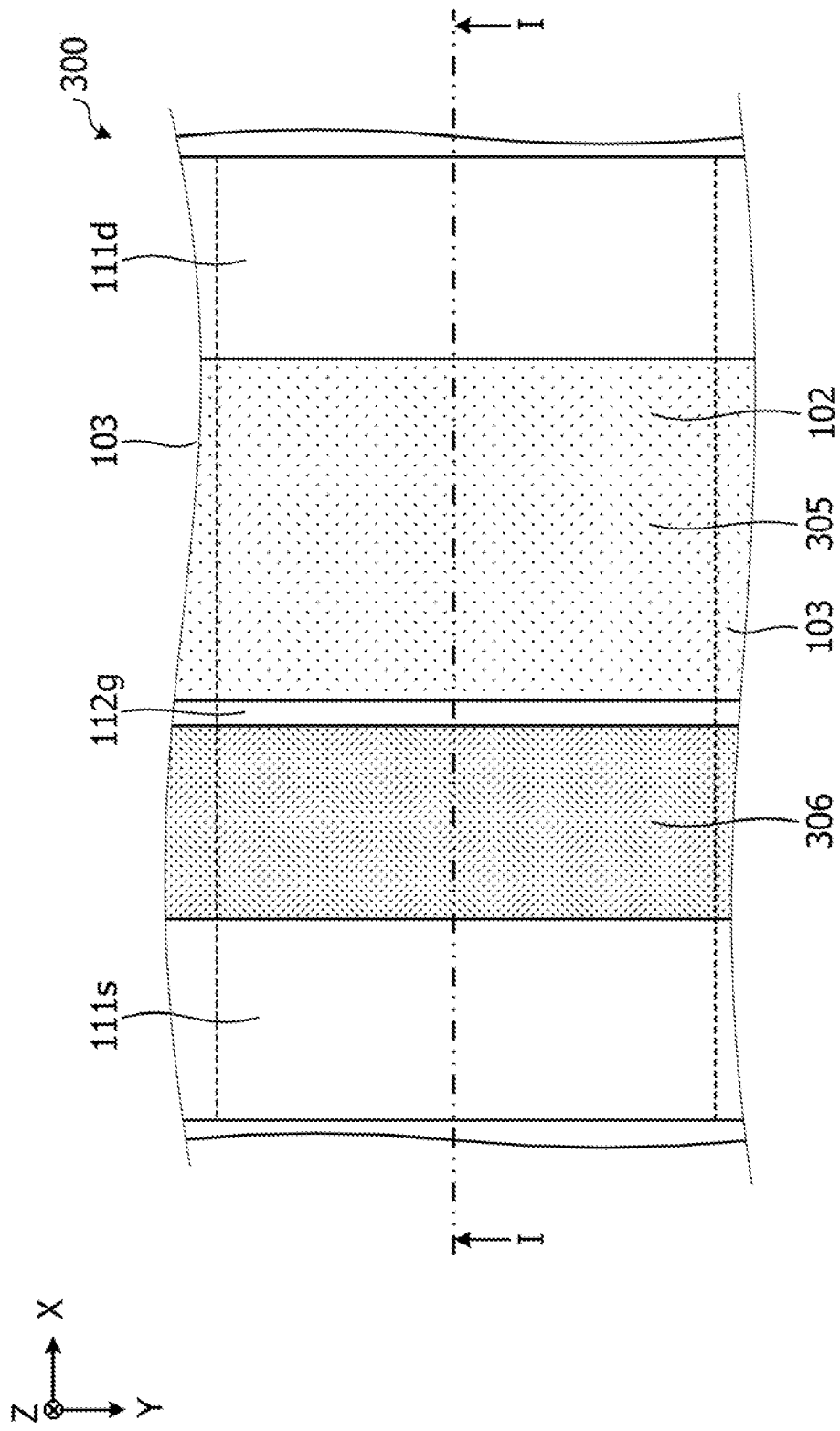
FIG. 10 is a diagram showing the layout of a compound semiconductor device according to a third embodiment.
Figure 11:
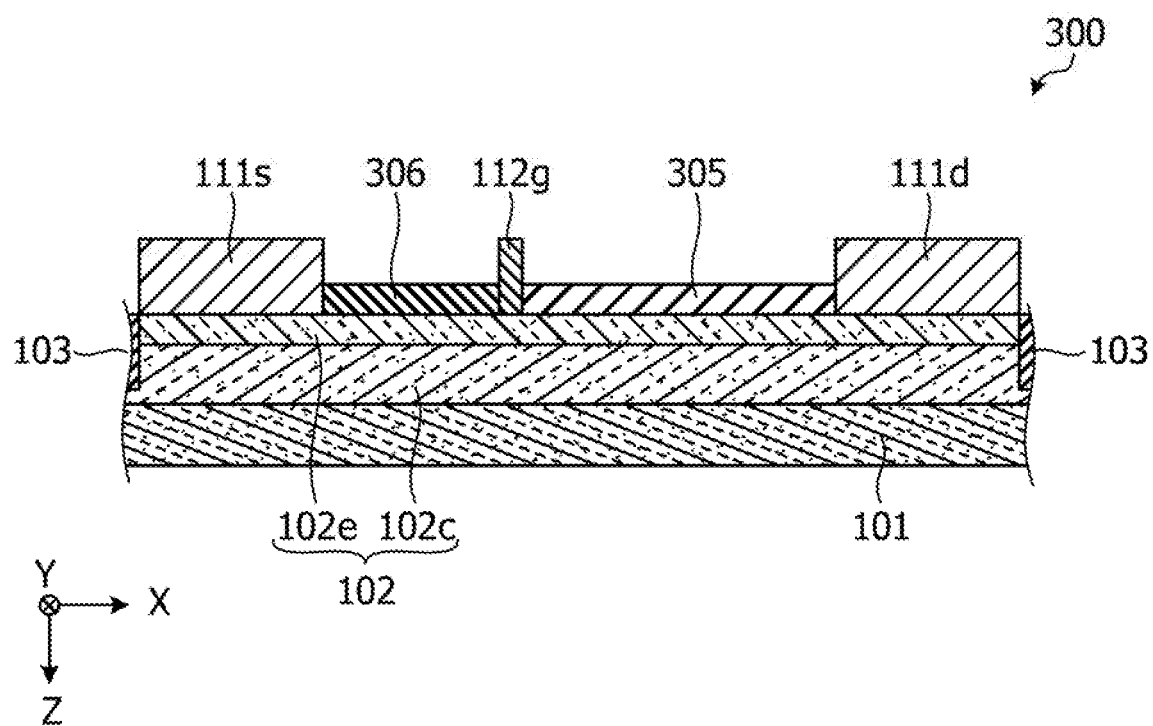
FIG. 11 is a cross-sectional diagram showing the structure of the compound semiconductor device according to the third embodiment.

A third embodiment relates to a compound semiconductor device including an HEMT. FIG. 10 is a diagram showing the layout of a compound semiconductor device according to the third embodiment. FIG. 11 is a cross-sectional diagram showing the structure of the compound semiconductor device according to the third embodiment. FIG. 11 corresponds to a cross-sectional view taken along the line I-I defined in FIG. 10.

As illustrated in FIGS. 10 and 11, a compound semiconductor device 300 according to the third embodiment includes a magnesium oxide (MgO) film 305 with a tensile stress as a specific example of the tensile stress film 105, and a magnesium oxide film 306 with a compressive stress as a specific example of the compressive stress film 106. Further, the protective film 104 is not formed. The compound semiconductor device 300 has the same configuration as that of the first embodiment in other respects. The magnesium oxide film 305 is an example of the first insulating film, and the magnesium oxide film 306 is an example of the second insulating film.

In a case where the silicon nitride film 905 is used as in the reference example, the electronic barrier of the silicon nitride film 905 may be insufficient when the Al proportion in the electron supply layer 902$e$ is high. In this embodiment, on the other hand, the magnesium oxide film 305 is used, and thus, a sufficient electronic barrier can be obtained even if a material with a high Al proportion x such as AlN is used for the electron supply layer 102$e$.

Accordingly, the magnesium oxide film 305 can reduce the injection of hot electrons into an insulating film in an electron trap and reduce current collapses more effectively than the silicon nitride film 905.

As will be described later in detail, the internal stress of a magnesium oxide film can be controlled with the annealing temperature or the like.

The protective film 104 is preferably included in the third embodiment. Further, the magnesium oxide film 305 is preferably designed to be at a distance from the drain electrode 111$d$ in the X direction, as in the second embodiment.

Even in a case where the magnesium oxide film 305 is not provided, it is possible to achieve the effect to increase efficiency through an increase in current density and a decrease in resistive loss, as long as the magnesium oxide film 306 is provided. Likewise, even in a case where the magnesium oxide film 306 is not provided, it is possible to achieve the effect to increase the drain breakdown voltage, as long as the magnesium oxide film 305 is provided.

Fourth Embodiment

A fourth embodiment relates to a method of manufacturing a compound semiconductor device including an HEMT. FIGS. 12A through 12M are cross-sectional diagrams illustrating the method of manufacturing a compound semiconductor device according to the fourth embodiment. FIGS. 12A through 12M show cross-sections perpendicular to the Y direction.

Figure 12A:
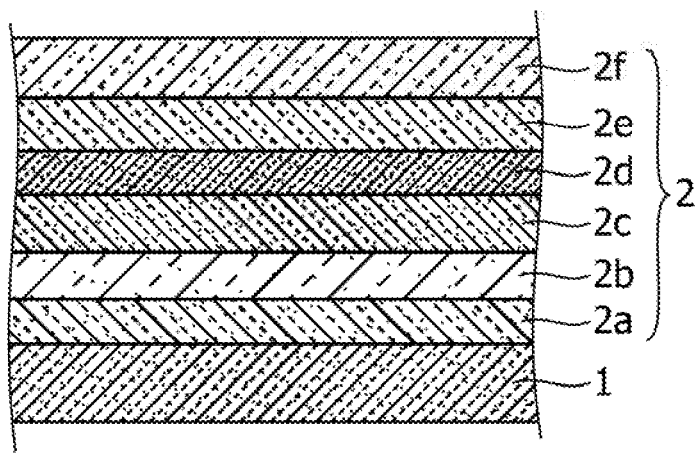
FIG. 12A is a cross-sectional diagram (part 1) illustrating a method of manufacturing a compound semiconductor device according to a fourth embodiment.

First, as illustrated in FIG. 12A, a nucleation layer 2$a$, a buffer layer 2$b$, an electron transit layer 2$c$, an intermediate layer 2$d$, an electron supply layer (a barrier layer) 2$e$, and a cap layer 2$f$ are epitaxially grown on a substrate 1, such as a semi-insulating SiC substrate, by a metal organic vapor phase epitaxy (MOVPE) technique, for example. The nucleation layer 2$a$, the buffer layer 2$b$, the electron transit layer 2$c$, the intermediate layer 2$d$, the electron supply layer 2$e$, and the cap layer 2$f$ are included in a semiconductor multilayer structure 2.

An AlN layer is formed as the nucleation layer 2$a$, for example. An AlGaN layer is formed as the buffer layer 2$b$, for example. A GaN layer (an i-GaN layer) not intentionally doped with impurities is formed as the electron transit layer 2$c$, for example. An AlN layer is formed as the intermediate layer 2$d$, for example. An AlGaN layer is formed as the electron supply layer 2$e$, for example. A GaN layer is formed as the cap layer 2$f$, for example.

In the formation of the semiconductor multilayer structure 2, a mixed gas of a trimethylaluminum (TMA) gas that is the Al source, a trimethylgallium (TMG) gas that is the Ga source, and an ammonia ($NH_3$) gas that is the N source is used, for example. At this stage, the presence/absence and the flow rates of the trimethylaluminum gas and the trimethylgallium gas are appropriately set in accordance with the composition of the compound semiconductor layer to be grown. Note that the intermediate layer 2$d$ between the electron transit layer 2$c$ and the electron supply layer 2$e$ may be formed as necessary. The cap layer 2$f$ may also be formed as necessary.

Figure 12B:
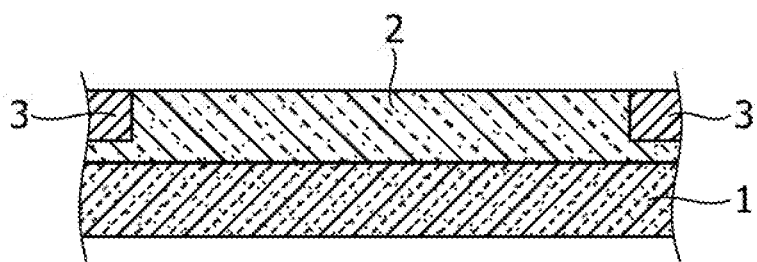
FIG. 12B is a cross-sectional diagram (part 2) illustrating the method of manufacturing the compound semiconductor device according to the fourth embodiment.
Figure 12B:
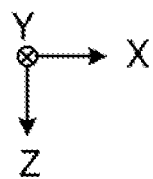

As illustrated in FIG. 12B, a device separation region 3 that defines a device region in the semiconductor multilayer structure 2 is then formed. In the formation of the device separation region 3, a photoresist pattern for exposing the region in which the device separation region 3 is to be formed is formed on the semiconductor multilayer structure 2, for example, and Ar ions or the like are implanted with this pattern serving as a mask. Dry etching using a chlorine-based gas may be performed with this pattern serving as an etching mask. The device separation region 3 may be designed to reach the inside of the substrate 1.

Figure 12C:
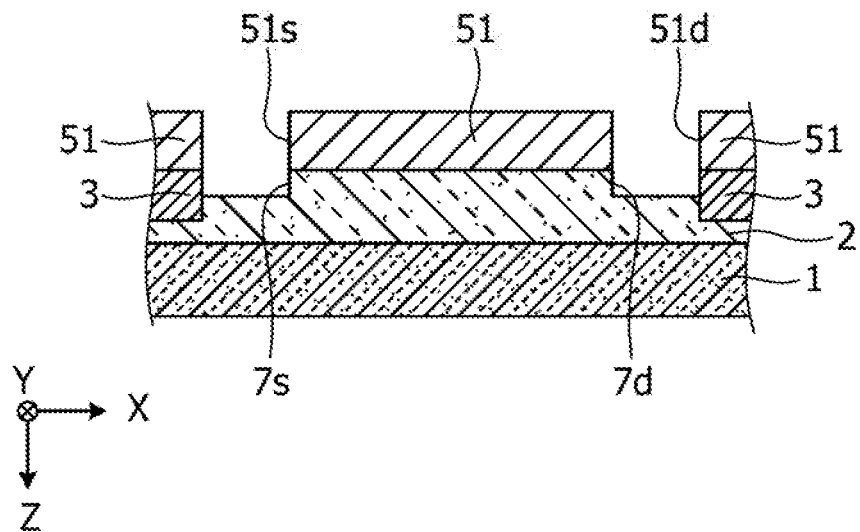
FIG. 12C is a cross-sectional diagram (part 3) illustrating the method of manufacturing the compound semiconductor device according to the fourth embodiment.

After that, as illustrated in FIG. 12C, a resist pattern 51 having an opening 51s in the region in which the source electrode is to be formed and an opening 51d in the region in which the drain electrode is to be formed on the semiconductor multilayer structure 2. With the resist pattern 51 serving as a mask, dry etching is then performed on the semiconductor multilayer structure 2, so that a recess 7s corresponding to the opening 51s and a recess 7d corresponding to the opening 51d are formed in the semiconductor multilayer structure 2. In the dry etching of the semiconductor multilayer structure 2, an inert gas and a chlorine-based gas such as a $Cl_2$ gas are used as the etching gas, for example. In the dry etching of the semiconductor multilayer structure 2, etching is performed on the cap layer 2f, for example. Note that, regarding the depth of the recesses 7s and 7d, part of the cap layer 2f may be left, or part of the electron supply layer 2e may be removed. That is, the depth of the recesses 7s and 7d does not necessarily match the thickness of the cap layer 2f. For example, the depth of the recesses 7s and 7d is equal to or smaller than twice the total thickness of the cap layer 2f and the electron supply layer 2e.

Figure 12D:
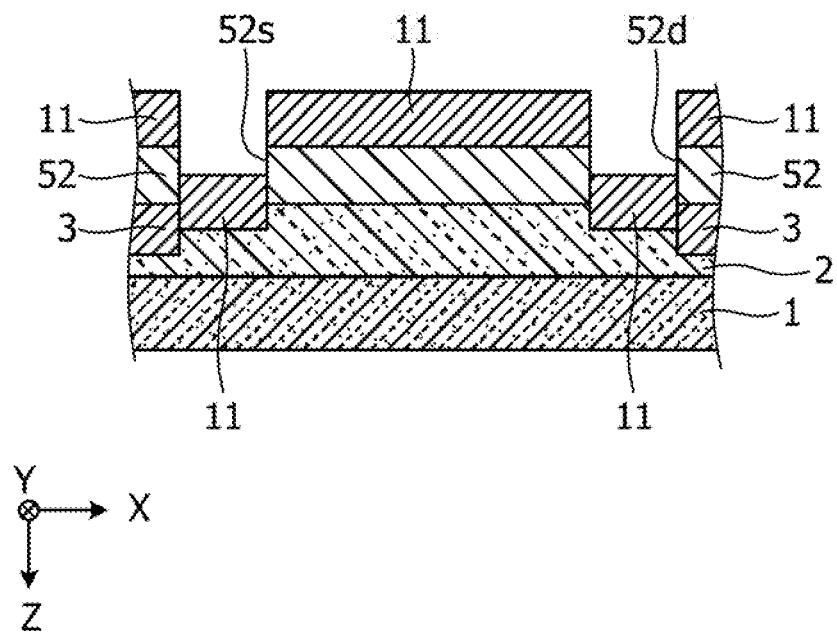
FIG. 12D is a cross-sectional diagram (part 4) illustrating the method of manufacturing the compound semiconductor device according to the fourth embodiment.

As illustrated in FIG. 12D, the resist pattern 51 is then removed with a warmed organic solvent. After that, a resist pattern 52 having an opening 52s in the region in which the source electrode is to be formed and an opening 52d in the region in which the drain electrode is to be formed is formed on the semiconductor multilayer structure 2. A metal film 11 is then formed in the recess 7s and in the recess 7d. In the formation of the metal film 11, a Ti layer is formed by a high-vacuum vapor deposition technique, and an Al layer is formed thereon by a high-vacuum vapor deposition technique, for example. The thickness of the Ti layer is 10 to 30 nm, and the thickness of the Al layer is 100 to 300 nm, for example. The metal film 11 is also formed on the resist pattern 52.

Figure 12E:
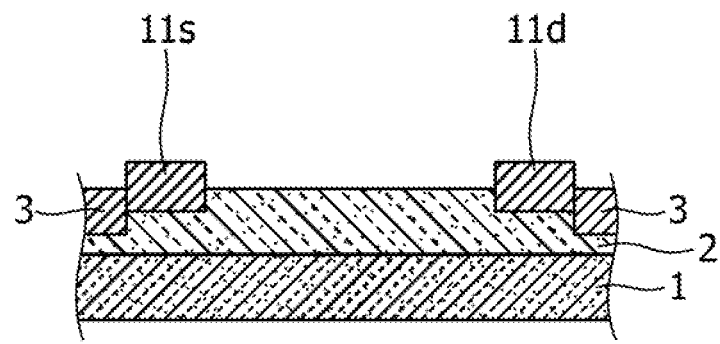
FIG. 12E is a cross-sectional diagram (part 5) illustrating the method of manufacturing the compound semiconductor device according to the fourth embodiment.
Figure 12E:
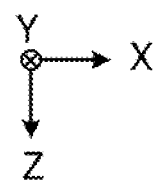

As illustrated in FIG. 12E, the resist pattern 52, together with the metal film 11 thereon, is then removed. As a result, a source electrode 11s is formed in the recess 7s, and a drain electrode 11d is formed in the recess 7d. In this manner, in the formation of the source electrode 11s and the drain electrode 11d, vapor deposition and lift-off techniques may be used, for example. After that, a heat treatment (an alloying process) at 550 to 650° C. is performed, so that the source electrode 11s and the drain electrode 11d are brought into ohmic contact with the surface of the semiconductor multilayer structure 2.

Figure 12F:
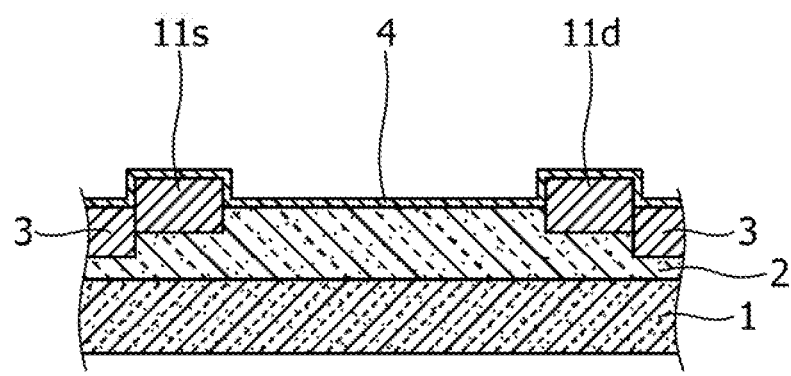
FIG. 12F is a cross-sectional diagram (part 6) illustrating the method of manufacturing the compound semiconductor device according to the fourth embodiment.
Figure 12F:
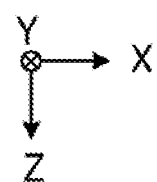

As illustrated in FIG. 12F, a protective film 4 is then formed on the semiconductor multilayer structure 2, the source electrode 11s, and the drain electrode 11d. As the protective film 4, a silicon nitride (SiN) film having a thickness of 10 to 30 nm is formed, for example. The protective film 4 may be formed by a plasma chemical vapor deposition (CVD) technique using $SiH_4$ and $NH_3$ as source gases, for example.

Figure 12G:
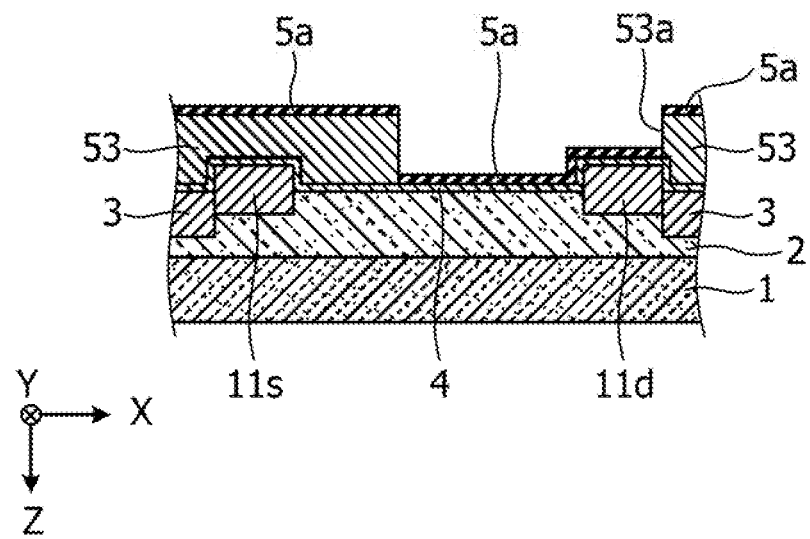
FIG. 12G is a cross-sectional diagram (part 7) illustrating the method of manufacturing the compound semiconductor device according to the fourth embodiment.

After that, as illustrated in FIG. 12G, a resist pattern 53 that has an opening 53a extending from above the drain electrode 11d to the end of the region in which the gate electrode is to be formed on the side of the drain electrode 11d is formed on the protective film 4. A magnesium oxide film 5a is then formed on the protective film 4 inside the opening 53a by a sputtering technique. The thickness of the magnesium oxide film 5a is 50 to 200 nm, for example. The magnesium oxide film 5a is also formed on the resist pattern 53.

Figure 12H:
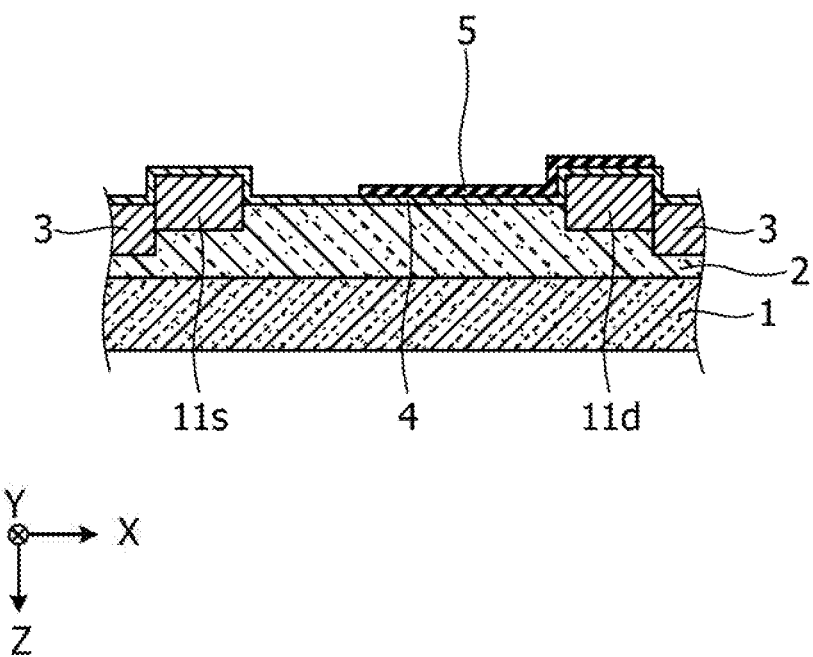
FIG. 12H is a cross-sectional diagram (part 8) illustrating the method of manufacturing the compound semiconductor device according to the fourth embodiment.

As illustrated in FIG. 12H, the resist pattern 53, together with the magnesium oxide film 5a thereon, is then removed. Specifically, the magnesium oxide film 5a not in direct contact with the protective film 4 is removed by a lift-off technique. After that, the magnesium oxide film 5a is heated, so that a tensile stress is generated therein, and a tensile stress film 5 is formed. In the heating, a temperature of 550 to 700° C. is maintained for 30 seconds to two minutes, for example.

Figure 12I:
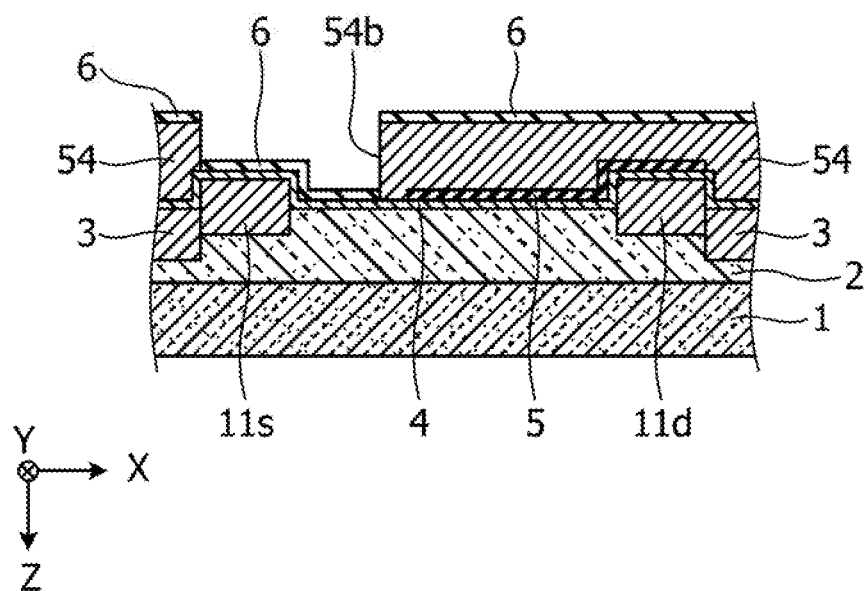
FIG. 12I is a cross-sectional diagram (part 9) illustrating the method of manufacturing the compound semiconductor device according to the fourth embodiment.

As illustrated in FIG. 12I, a resist pattern 54 that has an opening 54b extending from above the source electrode 11s to the end of the region in which the gate electrode is to be formed on the side of the source electrode 11s is then formed on the protective film 4 and the tensile stress film 5. After that, a compressive stress film 6 is formed on the protective film 4 inside the opening 54b. In the formation of the compressive stress film 6, a magnesium oxide film having a thickness of 50 to 200 nm is formed by a sputtering technique, for example. The compressive stress film 6 is also formed on the resist pattern 54.

Figure 13:
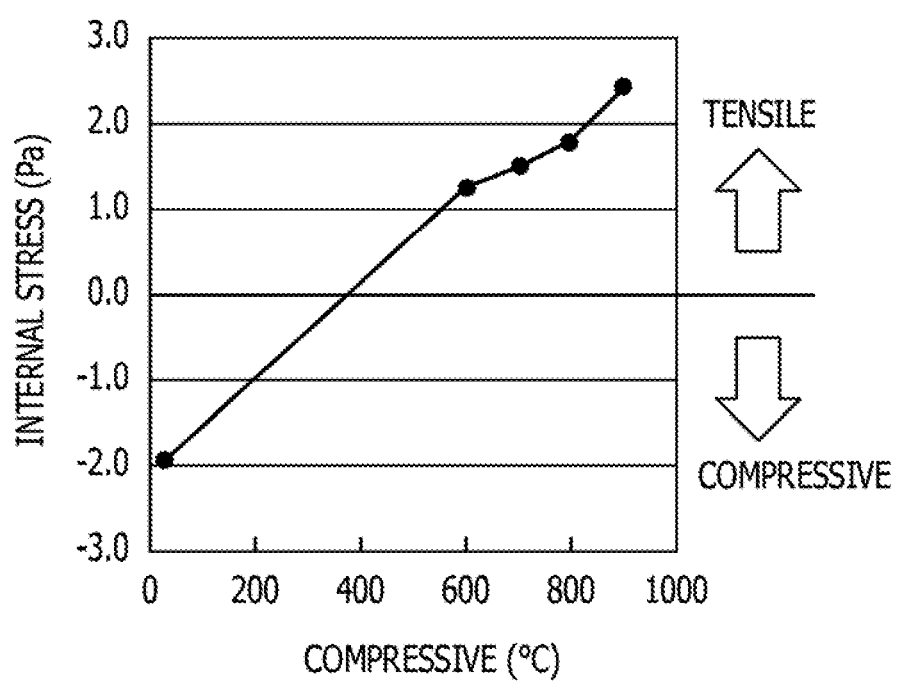
FIG. 13 is a graph showing the relationship between the heat treatment temperature and the internal stress of a magnesium oxide film.

The internal stress of the magnesium oxide film is now described. FIG. 13 is a graph showing the relationship between the heat treatment temperature and the internal stress of the magnesium oxide film. As illustrated in FIG. 13, the internal stress of the formed magnesium oxide film is a compressive stress, but the internal stress can be changed to a tensile stress through a heat treatment at 400° C. or higher.

Figure 12J:
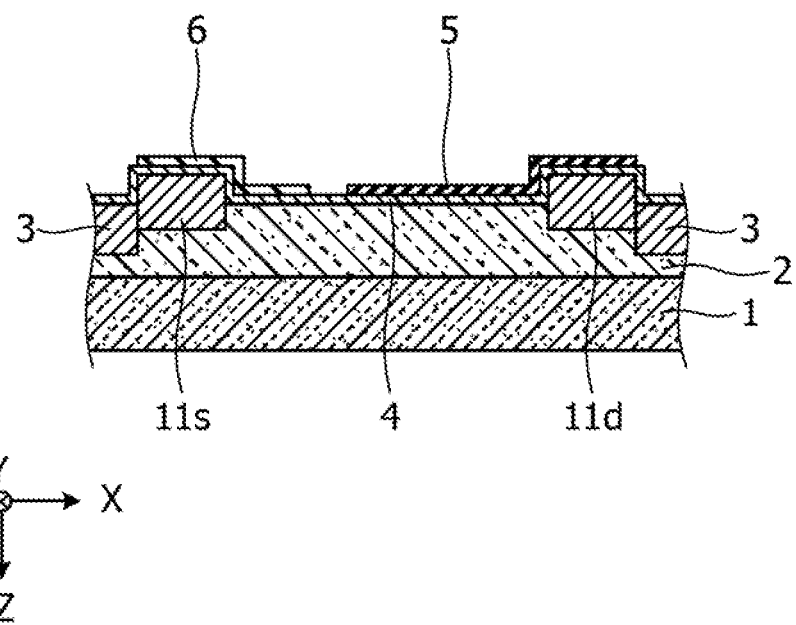
FIG. 12J is a cross-sectional diagram (part 10) illustrating the method of manufacturing the compound semiconductor device according to the fourth embodiment.

After the formation of the compressive stress film 6, the resist pattern 54, together with the compressive stress film 6 thereon, is removed, as illustrated in FIG. 12J.

Figure 12K:
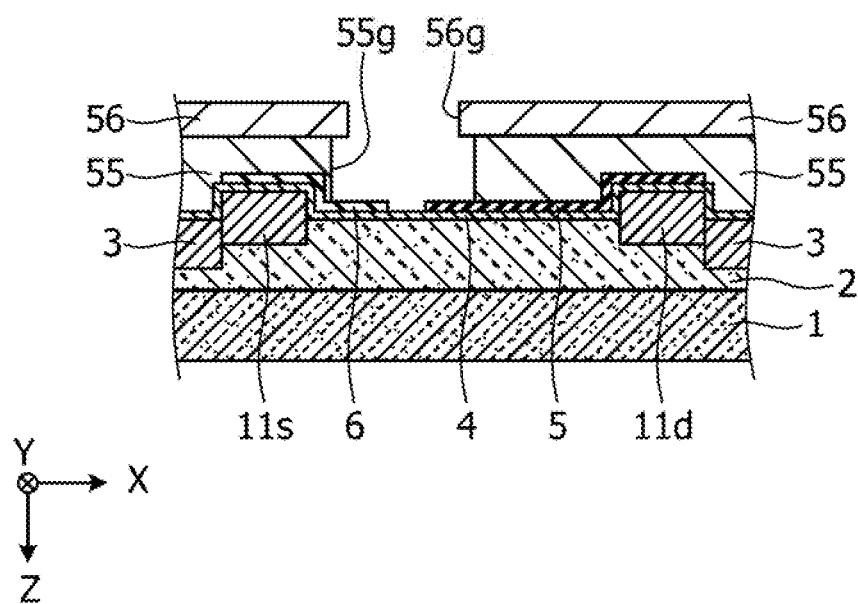
FIG. 12K is a cross-sectional diagram (part 11) illustrating the method of manufacturing the compound semiconductor device according to the fourth embodiment.

As illustrated in FIG. 12K, a resist pattern 55 having an opening 55g in the region in which the gate electrode is to be formed is then formed on the protective film 4, the tensile stress film 5, and the compressive stress film 6. At the same time, a resist pattern 56 having an opening 56g in the region where the gate electrode is to be formed is formed on the resist pattern 55. In the formation of the resist patterns 55 and 56, two resist layers are first formed. The opening 56g is then formed in the upper resist layer, so that the resist pattern 56 is formed. With the resist pattern 56 serving as a mask, the opening 55g is then formed in the lower resist layer, so that the resist pattern 55 having a setback structure with a size of 0.3 to 0.7 μm in the X direction is formed. Polymethylglutarimide (PMGI) (manufactured by Micro-Chem Corp., for example) may be used as the material of the resist pattern 55, for example, and ZEP520 manufactured by Zeon Corporation may be used as the material of the resist pattern 56, for example. These resist materials may be applied by a spin coating technique, and prebaking is performed on these resist materials after the application. In the exposure for forming the opening 56g, electron beam drawing is performed with a length of 1.0 to 1.5 μm in the X direction, for example, and ZEP-SD, manufactured by Zeon Corporation, may be used as the developer, for example. In the formation of the opening 55g, NMD-W, manufactured by Tokyo Ohka Kogyo Co., Ltd., may be used as the developer, for example. In this manner, a resist pattern having an eave structure (setback structure) is obtained.

Figure 12L:
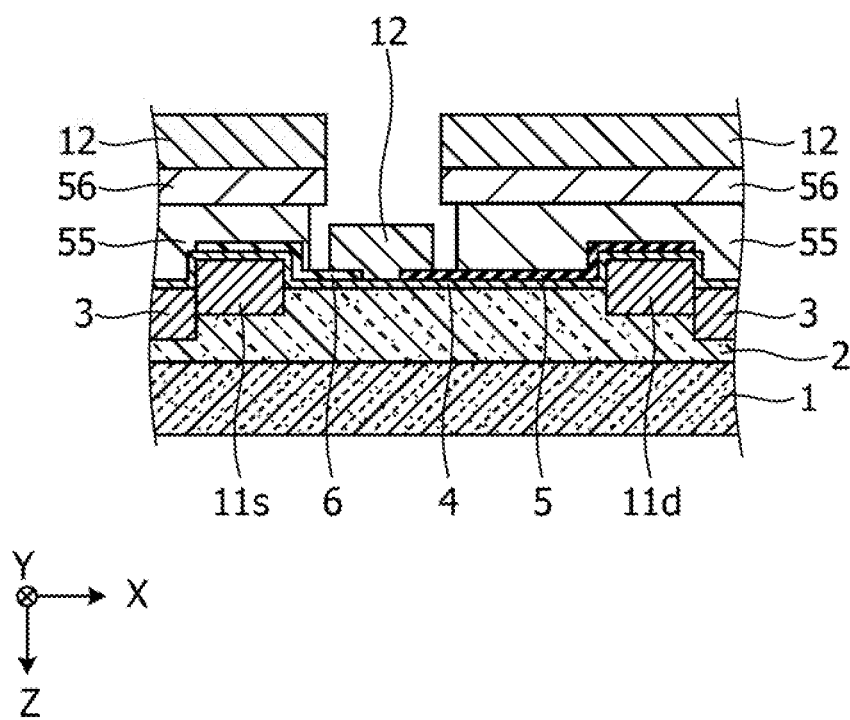
FIG. 12L is a cross-sectional diagram (part 12) illustrating the method of manufacturing the compound semiconductor device according to the fourth embodiment.

After that, as illustrated in FIG. 12L, a metal film 12 in contact with the protective film 4 through the gap between the tensile stress film 5 and the compressive stress film 6 is formed on the tensile stress film 5 and the compressive stress film 6 inside the openings 55g and 56g. In the formation of the metal film 12, a Ni layer is formed by a high-vacuum vapor deposition technique, and a Au layer is formed thereon by a high-vacuum vapor deposition technique, for example. The thickness of the Ni layer is 10 to 30 nm, and the thickness of the Au layer is 200 to 400 nm, for example. The metal film 12 is also formed on the resist pattern 56.

Figure 12M:
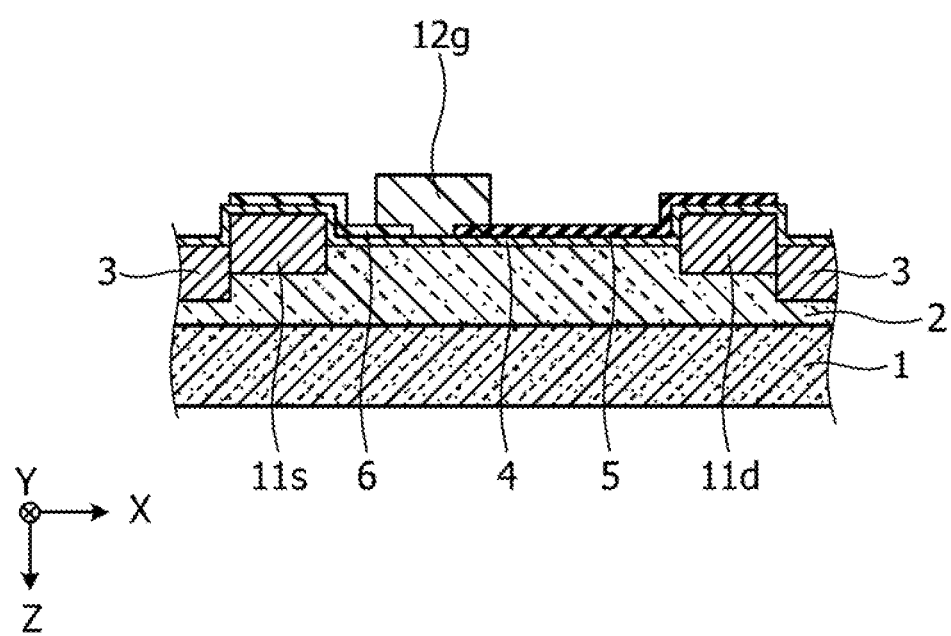
FIG. 12M is a cross-sectional diagram (part 13) illustrating the method of manufacturing the compound semiconductor device according to the fourth embodiment.

As illustrated in FIG. 12M, the resist patterns 56 and 55, together with the metal film 12 thereon, are then removed. As a result, a gate electrode 12g is formed on the protective film 4, the tensile stress film 5, and the compressive stress film 6. In this manner, in the formation of the gate electrode 12g, vapor deposition and lift-off techniques may be used, for example.

A protective film, wiring lines, and the like are then formed as needed, and thus, a compound semiconductor device is completed.

Note that the formation of the protective film 4 may be skipped. A silicon nitride film having a tensile stress may be formed as the tensile stress film 5, and a silicon nitride film having a compressive stress may be formed as the compressive stress film 6. An opening for the gate electrode may be formed in the protective film 4, and the gate electrode 112g may be in Schottky contact with the semiconductor multilayer structure 102.

Modification of the Fourth Embodiment

Figure 14A:
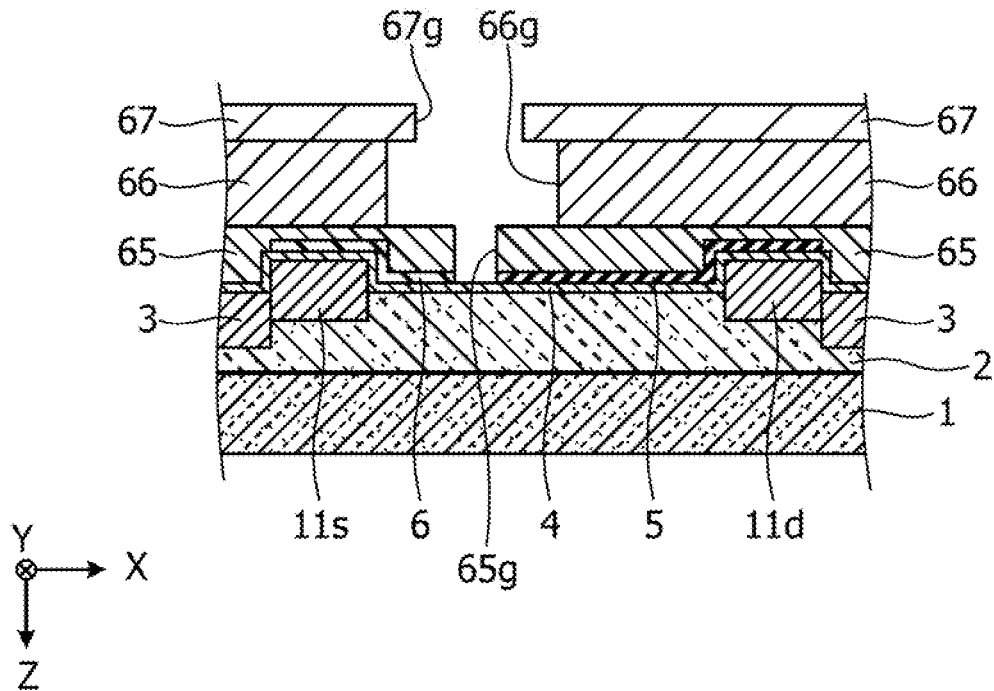
FIG. 14A is a cross-sectional diagram (part 1) illustrating a modification of the method of manufacturing the compound semiconductor device according to the fourth embodiment.
Figure 14B:
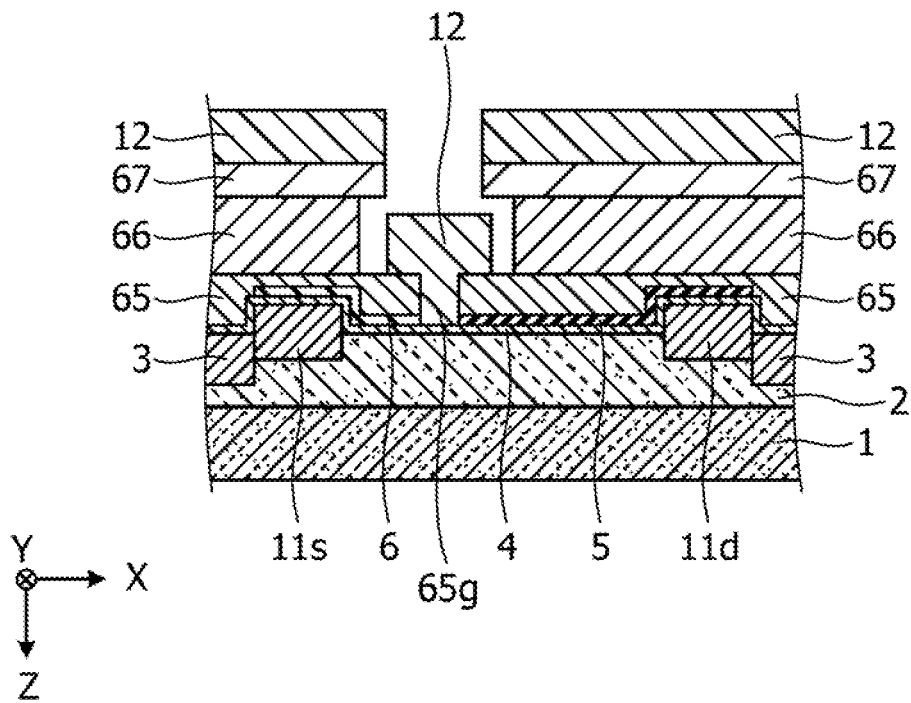
FIG. 14B is a cross-sectional diagram (part 2) illustrating the modification of the method of manufacturing the compound semiconductor device according to the fourth embodiment.
Figure 14C:
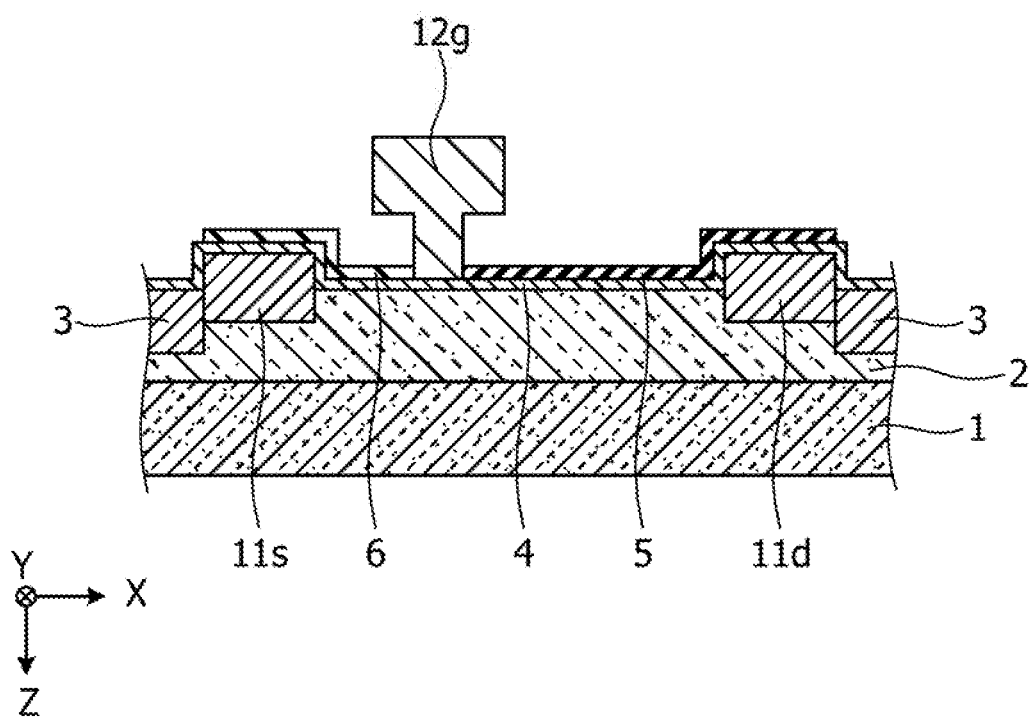
FIG. 14C is a cross-sectional diagram (part 3) illustrating the modification of the method of manufacturing the compound semiconductor device according to the fourth embodiment.

A modification of the fourth embodiment differs from the fourth embodiment in the method of forming the gate electrode 12g. FIGS. 14A through 14C are cross-sectional diagrams illustrating a modification of the method of manufacturing a compound semiconductor device according to the fourth embodiment.

In this modification, the processes up to the formation of the compressive stress film 6 and the removal of the resist pattern 54 are first performed in the same manner as in the fourth embodiment, as illustrated in FIG. 14A. A resist pattern 65 having an opening 65g in the region in which the gate electrode is to be formed is then formed on the protective film 4, the tensile stress film 5, and the compressive stress film 6. At the same time, a resist pattern 66 having an opening 66g in the region in which the gate electrode is to be formed is formed on the resist pattern 65, and a resist pattern 67 having an opening 67g in the region in which the gate electrode is to be formed is formed on the resist pattern 66. In the formation of the resist patterns 65 through 67, three resist layers are first formed. The opening 67g is then formed in the upper resist layer, so that the resist pattern 67 is formed. With the resist pattern 67 serving as a mask, the opening 66g is then formed in the intermediate resist layer, so that the resist pattern 66 having a setback structure with a size of 0.3 to 0.7 µm in the X direction is formed. After that, the opening 65g is formed in the lower resist layer, so that the resist pattern 65 is formed. Polymethyl methacrylate (PMMA) (manufactured by MicroChem Corp. Corp., for example) may be used as the material of the resist pattern 65, for example. Polymethylglutarimide (PMGI) (manufactured by US MicroChem Corp., for example) may be used as the material of the resist pattern 66, for example. ZEP520, manufactured by Zeon Corporation, may be used as the material of the resist pattern 67, for example. These resist materials may be applied by a spin coating technique, and prebaking is performed on these resist materials after the application. In the exposure for forming the opening 67g, electron beam drawing is performed with a length of 1.0 to 1.5 µm in the X direction, for example, and ZEP-SD, manufactured by Zeon Corporation, may be used as the developer, for example. In the formation of the opening 66g, NMD-W, manufactured by Tokyo Ohka Kogyo Co., Ltd., may be used as the developer, for example. In the exposure for forming the opening 65g, electron beam drawing is performed with a length of 0.3 to 0.5 µm in the X direction, for example, and ZMD-B, manufactured by Zeon Corporation, may be used as the developer, for example.

After that, as illustrated in FIG. 14B, a metal film 12 in contact with the protective film 4 through the opening 65g and the gap between the tensile stress film 5 and the compressive stress film 6 is formed on the resist pattern 65 inside the openings 66g and 67g. The metal film 12 is also formed on the resist pattern 67.

As illustrated in FIG. 14C, the resist patterns 67, 66, and 65, together with the metal film 12 thereon, are then removed. As a result, a gate electrode 12g that is in contact with the protective film 4 through the gap between the tensile stress film 5 and the compressive stress film 6 is formed. In this manner, in the formation of the gate electrode 12g, vapor deposition and lift-off techniques may be used, for example. According to this modification, the gate electrode 12g having a T-shaped cross-section is formed.

A protective film, wiring lines, and the like are then formed as needed, and thus, a compound semiconductor device is completed.

Fifth Embodiment

A fifth embodiment relates to a method of manufacturing a compound semiconductor device including an HEMT. FIGS. 15A through 15G are cross-sectional diagrams illustrating the method of manufacturing a compound semiconductor device according to the fifth embodiment. FIGS. 15A through 15G show cross-sections perpendicular to the Y direction.

Figure 15A:
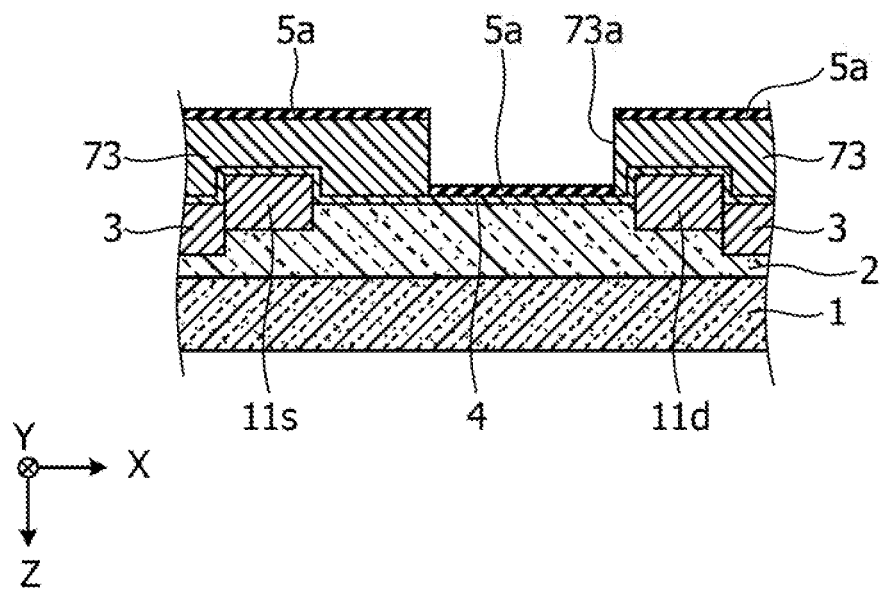
FIG. 15A is a cross-sectional diagram (part 1) illustrating a method of manufacturing a compound semiconductor device according to a fifth embodiment.

First, as illustrated in FIG. 15A, the processes up to the formation of the protective film 4 are performed in the same manner as in the fourth embodiment. A resist pattern 73 having an opening 73a that extends from a position closer to the side of the gate electrode 12g than to the drain electrode 11d, to the end of the region in which the gate electrode is to be formed on the side of the drain electrode 11d is formed on the protective film 4. For example, in the X direction, the end of the opening 73a on the side of the drain electrode 11d is at a distance of 10 to 50 nm from the end of the drain electrode 11d on the side of the gate electrode 12g. After that, a magnesium oxide film 5a is formed on the protective film 4 inside the opening 73a by a sputtering technique. The thickness of the magnesium oxide film 5a is 50 to 200 nm, for example. The magnesium oxide film 5a is also formed on the resist pattern 73.

Figure 15B:
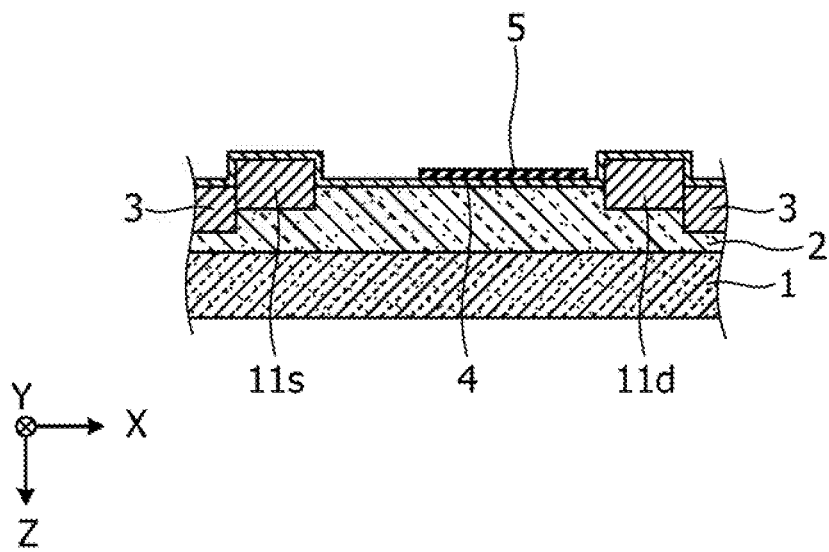
FIG. 15B is a cross-sectional diagram (part 2) illustrating the method of manufacturing the compound semiconductor device according to the fifth embodiment.

As illustrated in FIG. 15B, the resist pattern 73, together with the magnesium oxide film 5a thereon, is then removed. Specifically, the magnesium oxide film 5a not in direct contact with the protective film 4 is removed by a lift-off technique. After that, the magnesium oxide film 5a is heated, so that a tensile stress is generated therein, and a tensile stress film 5 is formed. In the heating, a temperature of 550 to 700° C. is maintained for 30 seconds to two minutes, for example.

Figure 15C:
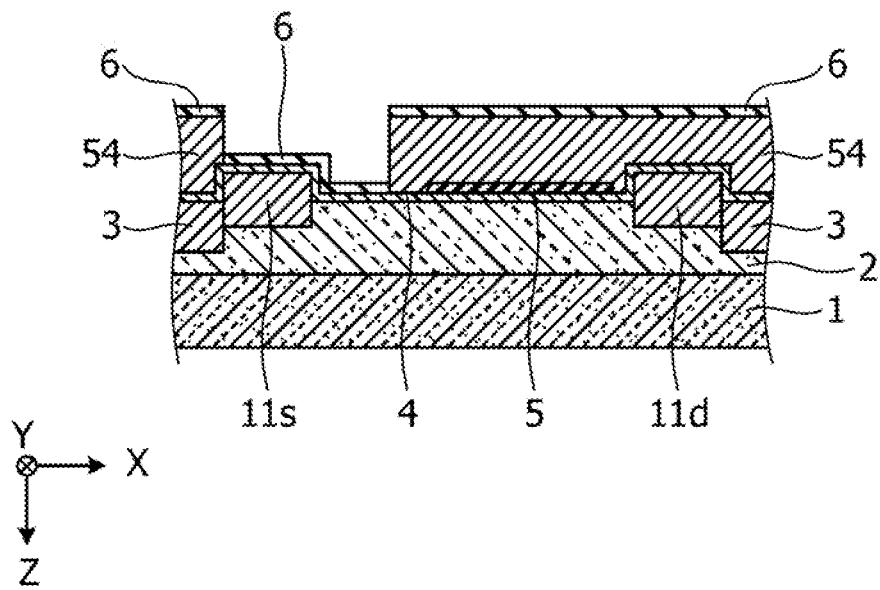
FIG. 15C is a cross-sectional diagram (part 3) illustrating the method of manufacturing the compound semiconductor device according to the fifth embodiment.

As illustrated in FIG. 15C, a resist pattern 54 is then formed, and a compressive stress film 6 is formed, in the same manner as in the fourth embodiment. In the formation of the compressive stress film 6, a magnesium oxide film having a thickness of 50 to 200 nm is formed by a sputtering technique, for example. The compressive stress film 6 is also formed on the resist pattern 54.

Figure 15D:
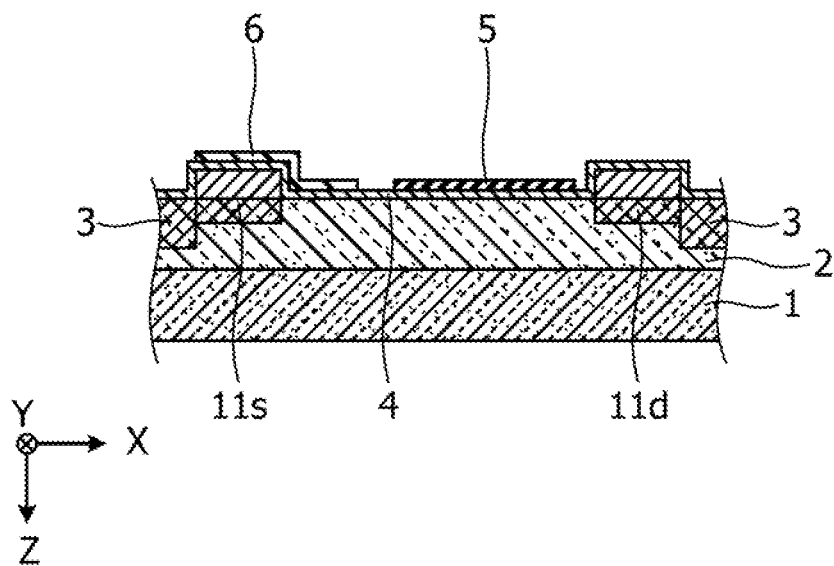
FIG. 15D is a cross-sectional diagram (part 4) illustrating the method of manufacturing the compound semiconductor device according to the fifth embodiment.

After the formation of the compressive stress film 6, the resist pattern 54, together with the compressive stress film 6 thereon, is removed, as illustrated in FIG. 15D.

Figure 15E:
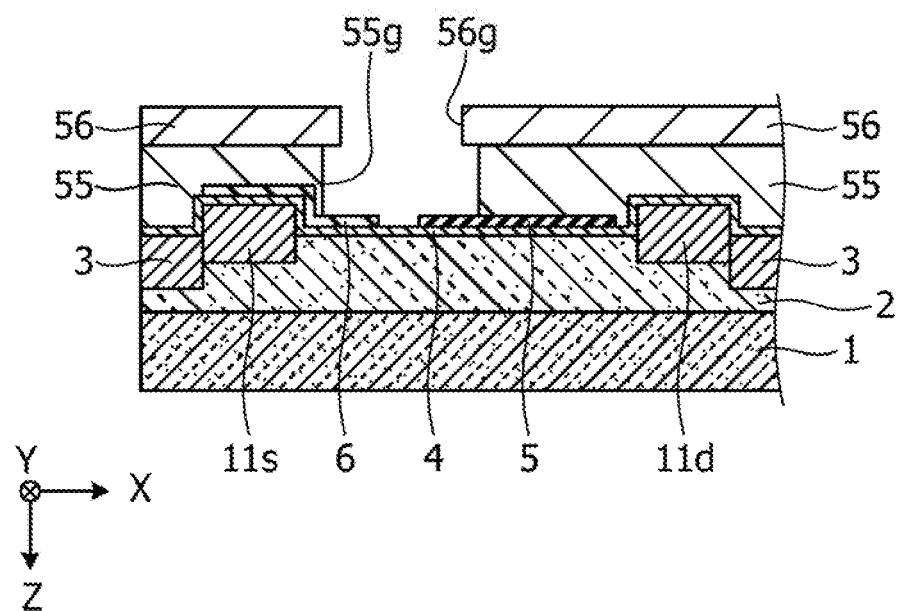
FIG. 15E is a cross-sectional diagram (part 5) illustrating the method of manufacturing the compound semiconductor device according to the fifth embodiment.

As illustrated in FIG. 15E, resist patterns 55 and 56 are then formed in the same manner as in the fourth embodiment.

Figure 15F:
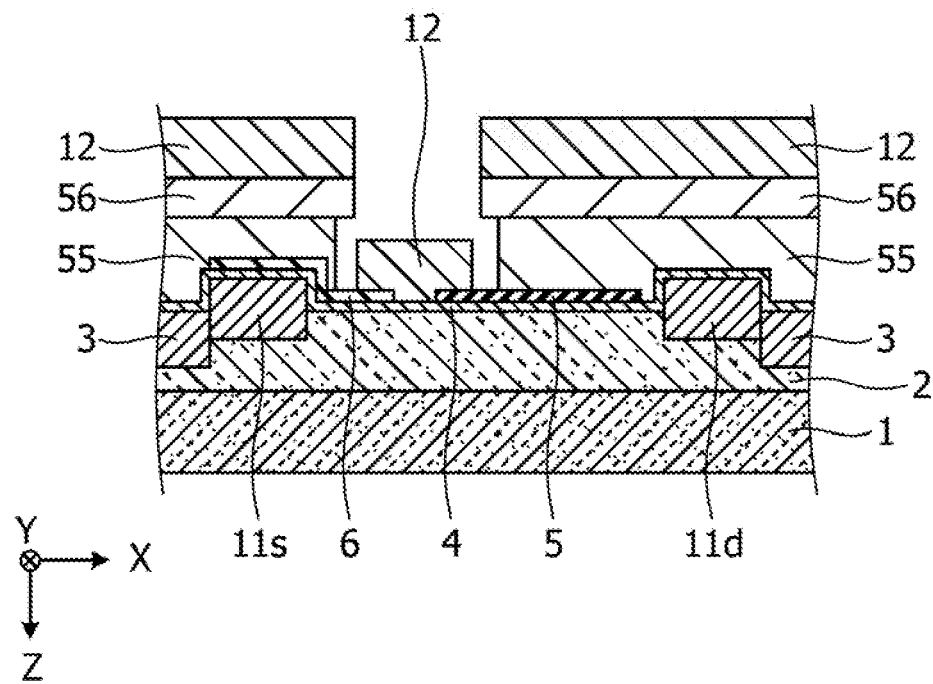
FIG. 15F is a cross-sectional diagram (part 6) illustrating the method of manufacturing the compound semiconductor device according to the fifth embodiment.

After that, as illustrated in FIG. 15F, a metal film 12 is formed in the same manner as in the fourth embodiment.

Figure 15G:
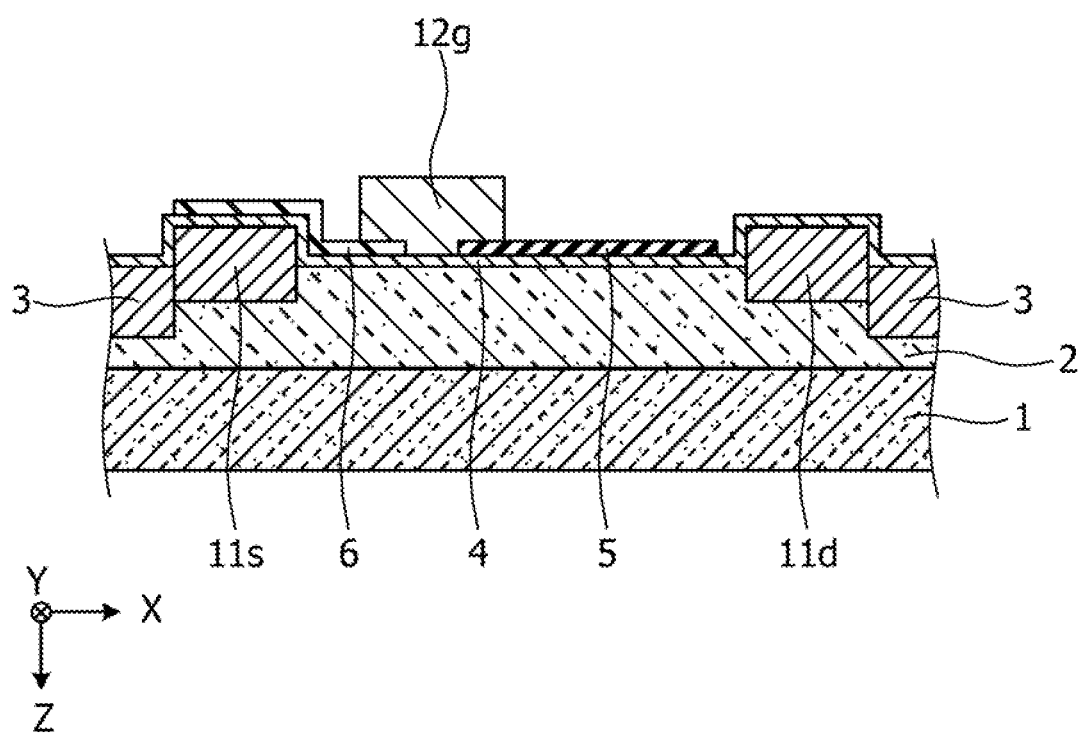
FIG. 15G is a cross-sectional diagram (part 7) illustrating the method of manufacturing the compound semiconductor device according to the fifth embodiment.

As illustrated in FIG. 15G, the resist patterns 56 and 55, together with the metal film 12 thereon, are then removed. As a result, a gate electrode 12g is formed on the protective film 4, the tensile stress film 5, and the compressive stress film 6. In this manner, in the formation of the gate electrode 12g, vapor deposition and lift-off techniques may be used, for example.

A protective film, wiring lines, and the like are then formed as needed, and thus, a compound semiconductor device is completed.

Note that the formation of the protective film 4 may be skipped. A silicon nitride film having a tensile stress may be formed as the tensile stress film 5, and a silicon nitride film having a compressive stress may be formed as the compressive stress film 6. An opening for the gate electrode may be formed in the protective film 4, and the gate electrode 112g may be in Schottky contact with the semiconductor multilayer structure 102.

Modification of the Fifth Embodiment

Figure 16A:
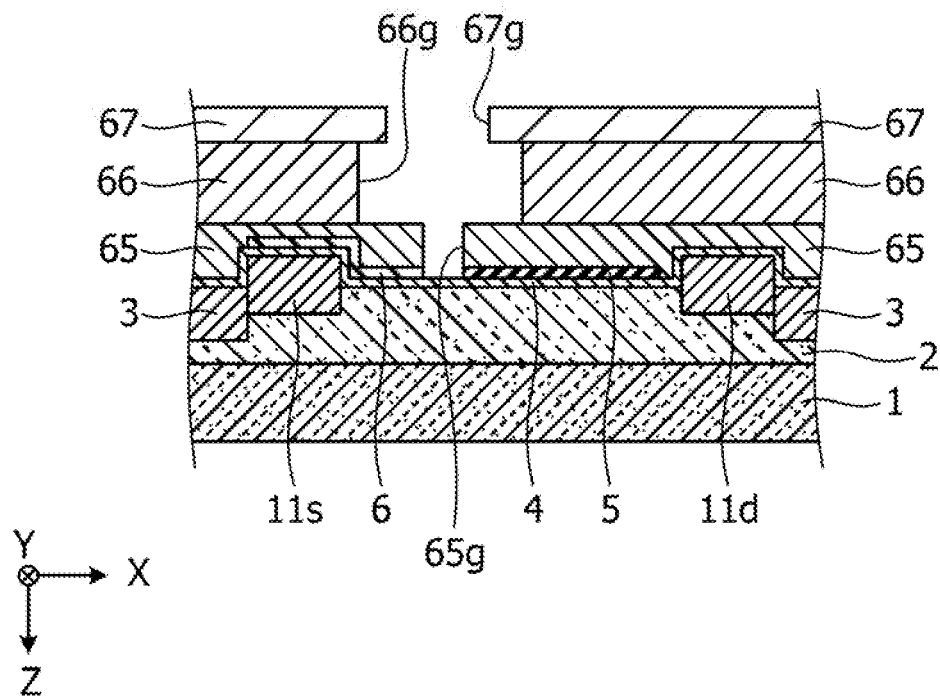
FIG. 16A is a cross-sectional diagram (part 1) illustrating a modification of the method of manufacturing the compound semiconductor device according to the fifth embodiment.
Figure 16B:
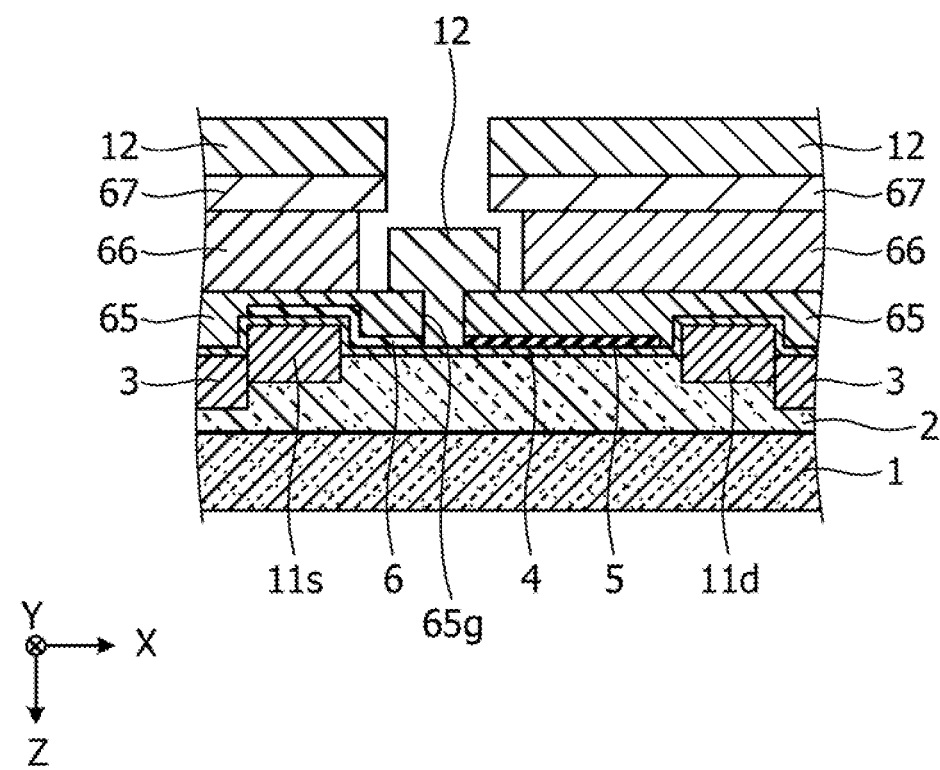
FIG. 16B is a cross-sectional diagram (part 2) illustrating the modification of the method of manufacturing the compound semiconductor device according to the fifth embodiment.
Figure 16C:
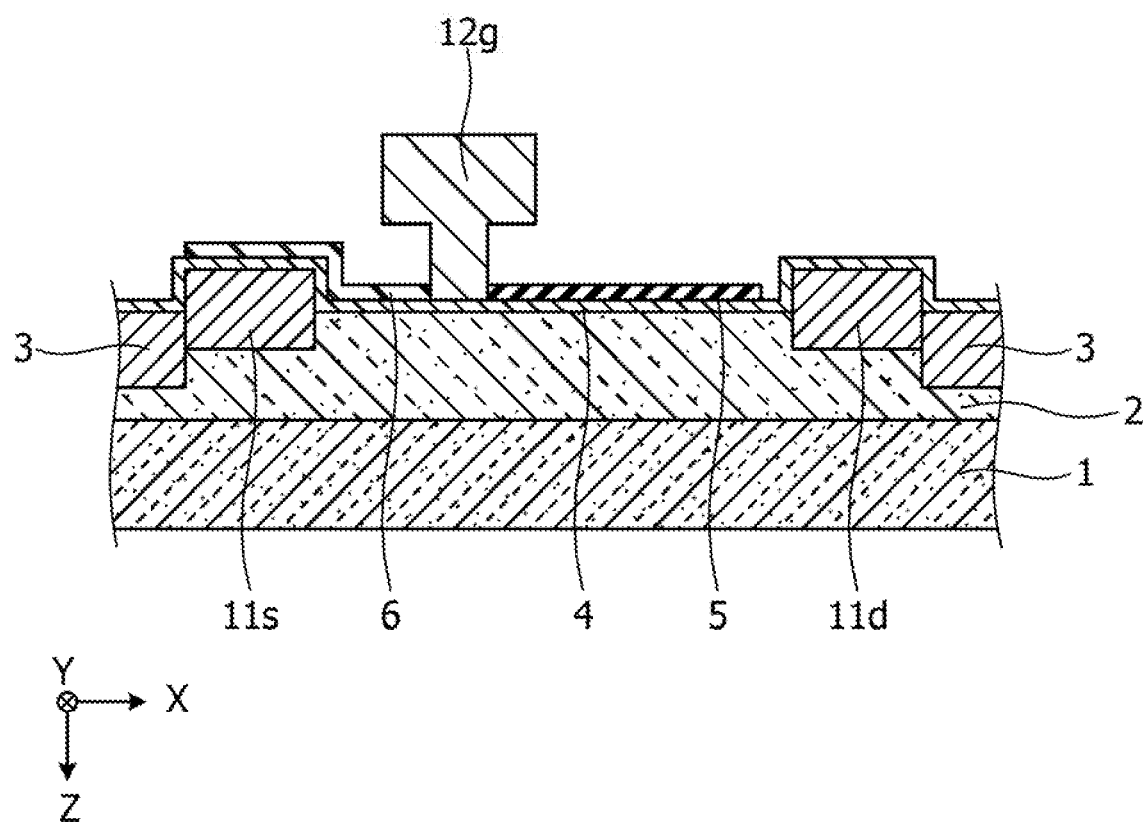
FIG. 16C is a cross-sectional diagram (part 3) illustrating the modification of the method of manufacturing the compound semiconductor device according to the fifth embodiment.

A modification of the fifth embodiment differs from the fifth embodiment in the method of forming the gate electrode 12g. FIGS. 16A through 16C are cross-sectional diagrams illustrating a modification of the method of manufacturing a compound semiconductor device according to the fifth embodiment.

In this modification, the processes up to the formation of the compressive stress film 6 and the removal of the resist pattern 54 are first performed in the same manner as in the fifth embodiment, as illustrated in FIG. 16A. Resist patterns 65, 66, and 67 are then formed in the same manner as in the modification of the fourth embodiment.

After that, as illustrated in FIG. 16B, a metal film 12 is formed in the same manner as in the modification of the fourth embodiment.

As illustrated in FIG. 16C, the resist patterns 67, 66, and 65, together with the metal film 12 thereon, are then removed. As a result, a gate electrode 12g that is in contact with the protective film 4 through the gap between the tensile stress film 5 and the compressive stress film 6 is formed. In this manner, in the formation of the gate electrode 12g, vapor deposition and lift-off techniques may be used, for example. According to this modification, the gate electrode 12g having a T-shaped cross-section is formed.

A protective film, wiring lines, and the like are then formed as needed, and thus, a compound semiconductor device is completed.

Figure 17A:
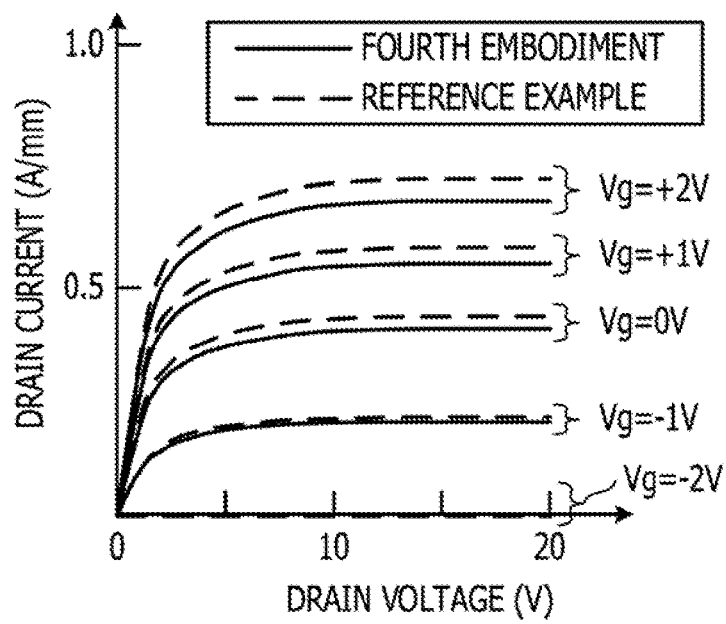
FIG. 17A is a diagram (part 1) showing the relationship between drain voltage and drain current.
Figure 17B:
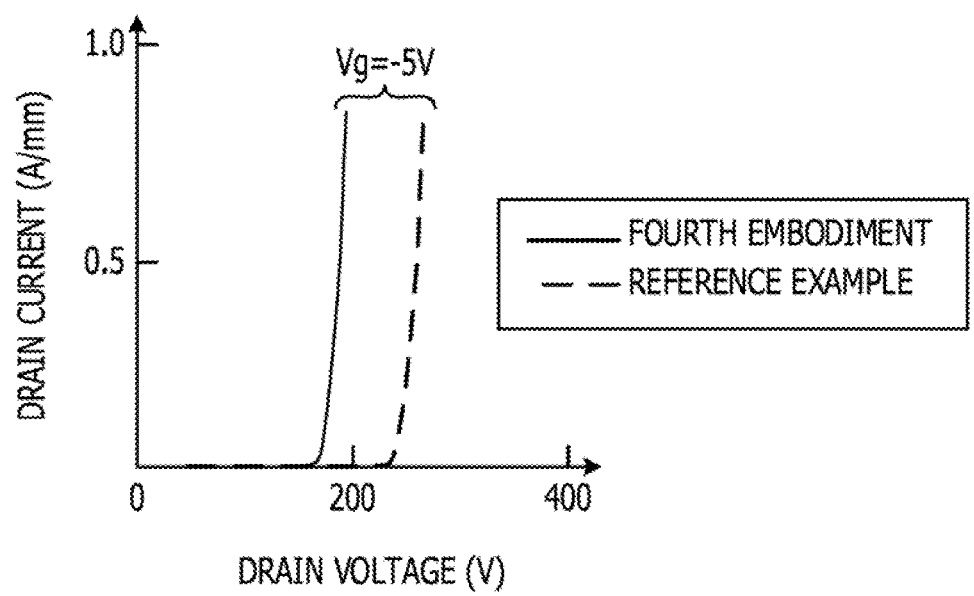
FIG. 17B is a diagram (part 2) showing the relationship between drain voltage and drain current.

FIGS. 17A and 17B show the three-terminal characteristics of a compound semiconductor device manufactured according to the fourth embodiment. FIG. 17A shows the relationship between the drain voltage and the drain current when the gate voltage Vg is set to −2 V, −1 V, 0 V, +1 V, and +2 V in a case where the drain voltage is 0 to 20V. FIG. 17B shows the relationship between the drain voltage and the drain current when the gate voltage Vg is −5 V in a case where the drain voltage is 0 to 200 V. FIGS. 17A and 17B also show the three-terminal characteristics of a reference example from which the formation of the tensile stress film 5 and the compressive stress film 6 is omitted.

As illustrated in FIGS. 17A and 17B, the compound semiconductor device manufactured according to the fourth embodiment can reduce the on-resistance, increase the drain current, and improve the drain breakdown voltage. This indicates that it is possible to achieve higher output and higher efficiency in an amplifier to which this compound semiconductor device is applied.

Sixth Embodiment

Figure 18:
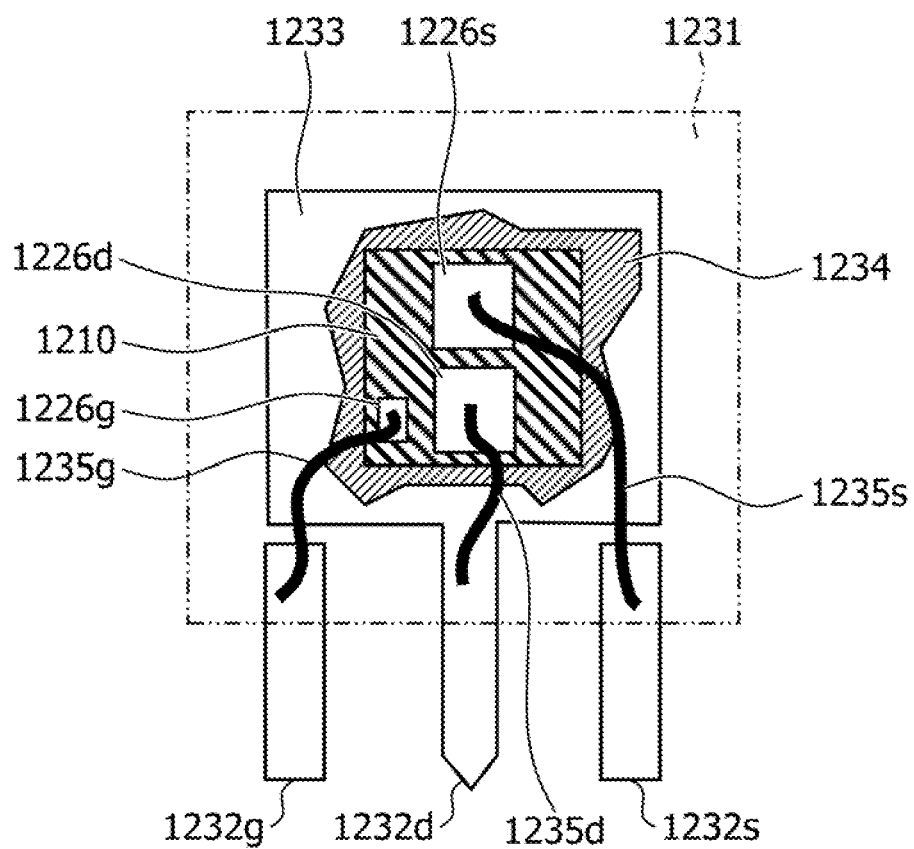
FIG. 18 is a diagram showing a discrete package according to a sixth embodiment.

Next, a sixth embodiment is described. The sixth embodiment relates to a discrete package of an HEMT. FIG. 18 is a diagram showing a discrete package according to the sixth embodiment.

In the sixth embodiment, as illustrated in FIG. 18, the back surface of a compound semiconductor device 1210 having the same structure as one of the first through third embodiments is secured to a land (a die pad) 1233 with a die attach agent 1234 such as solder. Further, a wire 1235d such as an Al wire is connected to a drain pad 1226d to which the drain electrode 11d is connected, and the other end of the wire 1235d is connected to a drain lead 1232d integrated with the land 1233. A wire 1235s such as an Al wire is connected to a source pad 1226s connected to the source electrode 11s, and the other end of the wire 1235s is connected to a source lead 1232s independent of the land 1233. A wire 1235g such as an Al wire is connected to a gate pad 1226g connected to the gate electrode 12g, and the other end of the wire 1235g is connected to a gate lead 1232g independent of the land 1233. The land 1233, the compound semiconductor device 1210, and the like are then packaged with a mold resin 1231 so that part of the gate lead 1232g, part of the drain lead 1232d, and part of the source lead 1232s stick out.

Such a discrete package may be manufactured in the following manner, for example. First, the compound semiconductor device 1210 is secured to the land 1233 of a lead frame with the die attach agent 1234 such as solder. Bonding is then performed with the wires 1235g, 1235d, and 1235s, so that the gate pad 1226g is connected to the gate lead 1232g of the lead frame, the drain pad 1226d is connected to the drain lead 1232d of the lead frame, and the source pad 1226s is connected to the source lead 1232s of the lead frame. After that, sealing using the mold resin 1231 is performed by a transfer molding technique. The lead frame is then cut off and detached.

Seventh Embodiment

Figure 19:
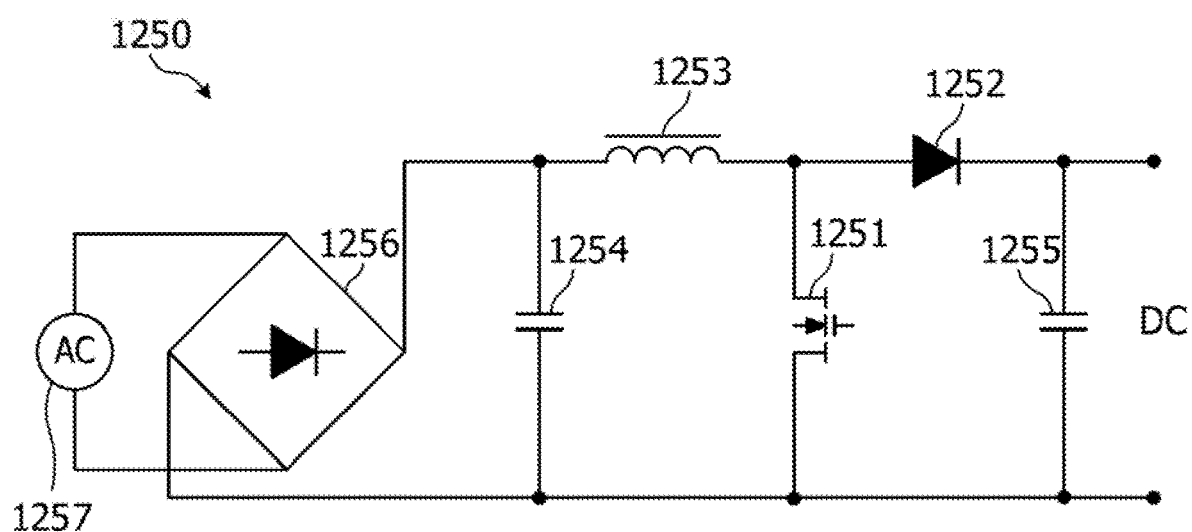
FIG. 19 is a connection wiring diagram showing a PFC circuit according to a seventh embodiment.

Next, a seventh embodiment is described. The seventh embodiment relates to a power factor correction (PFC) circuit including an HEMT. FIG. 19 is a connection wiring diagram showing a PFC circuit according to the seventh embodiment.

A PFC circuit 1250 includes a switch element (a transistor) 1251, a diode 1252, a choke coil 1253, capacitors 1254 and 1255, a diode bridge 1256, and an alternating-current power supply (AC) 1257. Further, the drain electrode of the switch element 1251 is connected to the anode terminal of the diode 1252 and one terminal of the choke coil 1253. The source electrode of the switch element 1251 is connected to one terminal of the capacitor 1254 and one terminal of the capacitor 1255. The other terminal of the capacitor 1254 and the other terminal of the choke coil 1253 are connected. The other terminal of the capacitor 1255 and the cathode terminal of the diode 1252 are connected. Further, a gate driver is connected to the gate electrode of the switch element 1251. The AC 1257 is connected between both terminals of the capacitor 1254 via the diode bridge 1256. A direct-current power supply (DC) is connected between both terminals of the capacitor 1255. Further, in this embodiment, a compound semiconductor device having the same structure as that of one of the first through third embodiments is used for the switch element 1251.

In the manufacturing of the PFC circuit 1250, the switch element 1251 is connected to the diode 1252, the choke coil 1253, and the like with solder or the like, for example.

Eighth Embodiment

Figure 20:
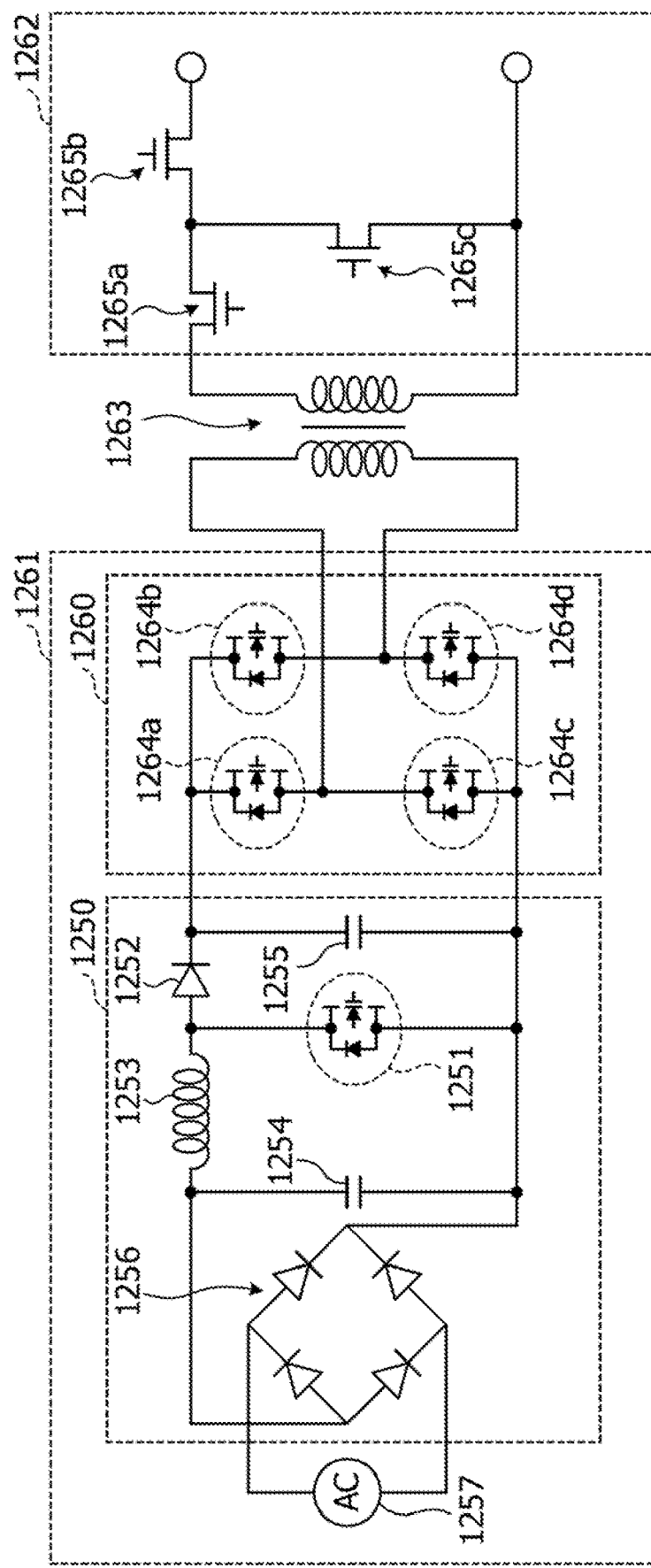
FIG. 20 is a connection wiring diagram showing a power supply device according to an eighth embodiment.

Next, an eighth embodiment is described. The eighth embodiment relates to a power supply device including an HEMT suitable for a server power supply. FIG. 20 is a connection wiring diagram showing a power supply device according to the eighth embodiment.

The power supply device includes a high-voltage primary-side circuit 1261, a low-voltage secondary-side circuit 1262, and a transformer 1263 disposed between the primary-side circuit 1261 and the secondary-side circuit 1262.

The primary-side circuit 1261 includes the PFC circuit 1250 according to the seventh embodiment, and an inverter circuit such as a full-bridge inverter circuit 1260 connected between both terminals of the capacitor 1255 of the PFC circuit 1250. The full-bridge inverter circuit 1260 includes a plurality (four in this example) of switch elements 1264a, 1264b, 1264c, and 1264d.

The secondary-side circuit 1262 includes a plurality (three in this example) of switch elements 1265a, 1265b, and 1265c.

In this embodiment, compound semiconductor devices each having the same structure as that of one of the first through third embodiments are used for the switch element 1251 of the PFC circuit 1250 of the primary-side circuit 1261, and the switch elements 1264a, 1264b, 1264c, and 1264d of the full-bridge inverter circuit 1260. Meanwhile, normal MIS field effect transistors (FETs) using silicon are used for the switch elements 1265a, 1265b, and 1265c of the secondary-side circuit 1262.

Ninth Embodiment

Figure 21:
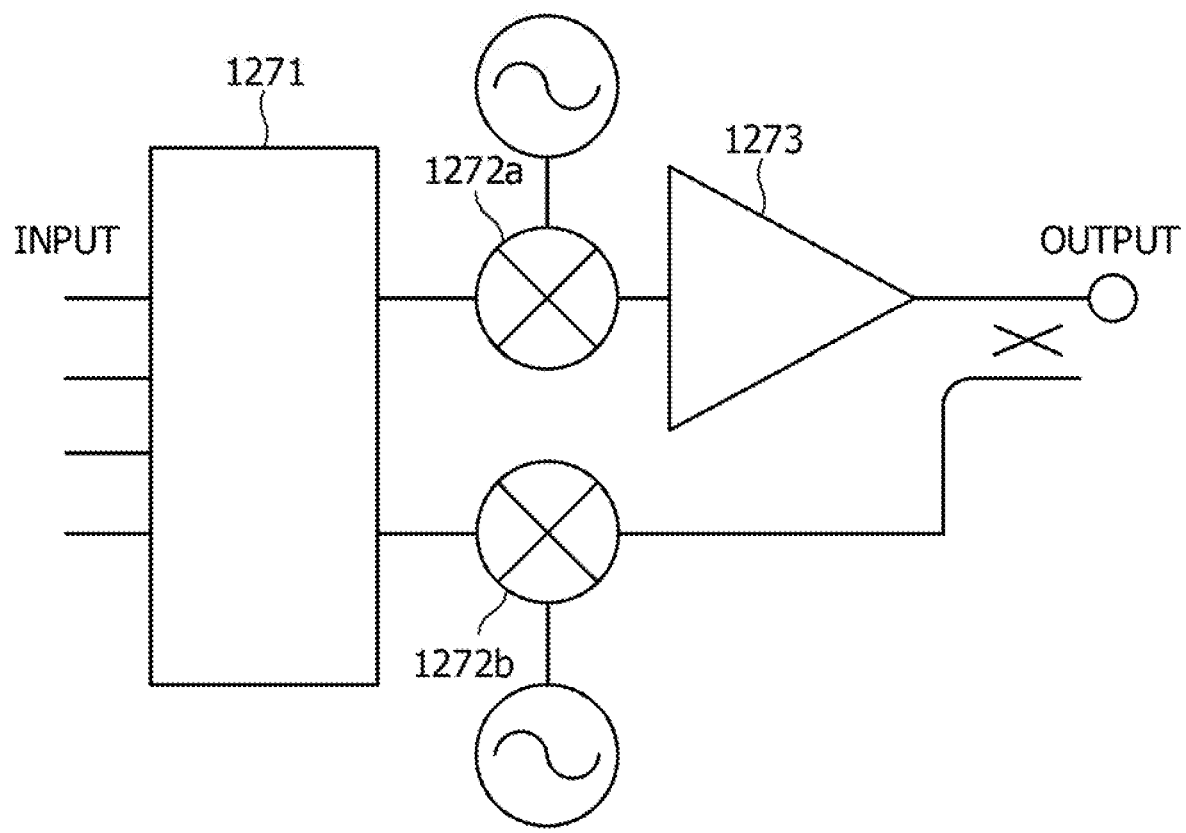
FIG. 21 is a connection wiring diagram showing an amplifier according to a ninth embodiment.

Next, a ninth embodiment is described. The ninth embodiment relates to an amplifier including an HEMT. FIG. 21 is a connection wiring diagram showing an amplifier according to the ninth embodiment.

The amplifier includes a digital predistortion circuit 1271, mixers 1272a and 1272b, and a power amplifier 1273.

The digital predistortion circuit 1271 compensates for nonlinear distortion of an input signal. The mixer 1272a mixes the input signal compensated for its nonlinear distortion with an AC signal. The power amplifier 1273 includes a compound semiconductor device having the same structure as that of one of the first through third embodiments, and amplifies the input signal mixed with the AC signal. Note that, in this embodiment, switching is performed with a switch, for example, so that the signal on the output side can be mixed with an AC signal by the mixer 1272b and be transmitted to the digital predistortion circuit 1271. This amplifier can be used as a high-frequency amplifier or a high-power amplifier. A high-frequency amplifier may be used in a transmission/reception device for mobile phone base stations, a radar device, and a microwave generator, for example.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device, comprising:
a semiconductor multilayer structure including an electron transit layer and an electron supply layer of a compound semiconductor;
a source electrode, a gate electrode, and a drain electrode that are disposed above the semiconductor multilayer structure and are aligned in a first direction;
a first insulating film of a magnesium oxide that is formed on the semiconductor multilayer structure between the gate electrode and the drain electrode, and has a tensile stress; and
a second insulating film of a magnesium oxide that is formed on the semiconductor multilayer structure between the gate electrode and the source electrode, and has a compressive stress.

2. The compound semiconductor device according to claim 1, wherein the electron supply layer includes a metal nitride, and at least 32% of the metal atoms in the metal nitride is Al.

3. The compound semiconductor device according to claim 2, wherein the electron supply layer has a thickness not greater than 10 nm.

4. The compound semiconductor device according to claim 1, wherein the first insulating film is at a distance from the drain electrode.

5. A method of manufacturing a compound semiconductor device, the method comprising:
forming a semiconductor multilayer structure including an electron transit layer and an electron supply layer of a compound semiconductor;
forming a source electrode, a gate electrode, and a drain electrode that are aligned in a first direction above the semiconductor multilayer structure;
forming a first insulating film of a magnesium oxide on the semiconductor multilayer structure between the gate electrode and the drain electrode, the first insulating film having a tensile stress; and
forming a second insulating film of a magnesium oxide on the semiconductor multilayer structure between the gate electrode and the source electrode, the second insulating film having a compressive stress.

\* \* \* \* \*